(12) United States Patent
Horio et al.

(10) Patent No.: US 7,411,220 B2
(45) Date of Patent: Aug. 12, 2008

(54) SEMICONDUCTOR LIGHT EMITTING DEVICE AND MANUFACTURING METHOD THEREOF

(75) Inventors: Naochika Horio, Tokyo (JP); Munehiro Kato, Tokyo (JP); Masahiko Tsuchiya, Tokyo (JP); Satoshi Tanaka, Tokyo (JP)

(73) Assignee: Stanley Electric Co. Ltd., Tokyo (JP)

( * ) Notice: Subject to any disclaimer, the term of this patent is extended or adjusted under 35 U.S.C. 154(b) by 481 days.

(21) Appl. No.: 11/154,814

(22) Filed: Jun. 17, 2005

(65) Prior Publication Data

US 2005/0281303 A1 Dec. 22, 2005

(30) Foreign Application Priority Data

Jun. 18, 2004 (JP) .............................. 2004-180915

(51) Int. Cl.
*H01L 29/26* (2006.01)
(52) U.S. Cl. .......................... 257/79; 257/81; 257/86; 257/91; 257/95; 257/98; 257/99; 257/E33.006; 257/E21.245; 438/22; 438/29; 438/39
(58) Field of Classification Search ................... 257/79, 257/81, 86, 91, 95, 98, 99, E33.006, E21.245
See application file for complete search history.

(56) References Cited

U.S. PATENT DOCUMENTS

| 6,066,861 | A | 5/2000 | Hohn et al. ................... 257/99 |
| 6,245,259 | B1 | 6/2001 | Hohn et al. ............. 252/301.36 |
| 6,277,301 | B1 | 8/2001 | Hohn et al. ............. 252/301.36 |
| 6,576,930 | B2 | 7/2003 | Reeh et al. ................... 257/98 |
| 6,592,780 | B2 | 7/2003 | Hohn et al. ............. 252/301.36 |
| 6,613,247 | B1 | 9/2003 | Hohn et al. ............. 252/301.36 |
| 6,630,689 | B2 | 10/2003 | Bhat et al. ................... 257/79 |
| 6,669,866 | B1 | 12/2003 | Kummer et al. ........ 252/301.4 R |
| 6,774,401 | B2 | 8/2004 | Nakada et al. ................ 257/82 |
| 6,809,342 | B2 | 10/2004 | Harada ........................ 257/79 |
| 6,812,500 | B2 | 11/2004 | Reeh et al. .................... 257/98 |
| 7,053,413 | B2 * | 5/2006 | D'Evelyn et al. ............. 257/79 |

(Continued)

FOREIGN PATENT DOCUMENTS

JP 10-190065 7/1998

(Continued)

*Primary Examiner*—Thanh V Pham
(74) *Attorney, Agent, or Firm*—Cermak Kenealy & Vaidya LLP

(57) ABSTRACT

A semiconductor light emitting device can have stable electric characteristics and can emit light with high intensity from a substrate surface. The device can include a transparent substrate and a semiconductor layer on the substrate. The semiconductor layer can include a first conductive type semiconductor layer, a luminescent layer, a second conductive type semiconductor layer, and first and second electrodes disposed to make contact with the first and second conductive type semiconductor layers, respectively. The first conductive type semiconductor layer, the luminescent layer, and the second conductive type semiconductor layer can be laminated in order from the side adjacent the substrate. An end face of the semiconductor layer can include a first terrace provided in an end face of the first conductive type semiconductor layer in parallel with the substrate surface, and an inclined end face region provided nearer to the substrate than the first terrace. The first electrode disposed in the inclined end face region can reflect light emitted from the luminescent layer to the substrate.

30 Claims, 20 Drawing Sheets

U.S. PATENT DOCUMENTS

| | | | |
|---|---|---|---|
| 2004/0113550 A1* | 6/2004 | Adachi et al. | 313/512 |
| 2006/0110839 A1* | 5/2006 | Dawson et al. | 438/22 |
| 2006/0231852 A1* | 10/2006 | Kususe et al. | 257/99 |

FOREIGN PATENT DOCUMENTS

| | | |
|---|---|---|
| JP | 11-330559 | 11/1999 |
| JP | 2001-127346 | 5/2001 |
| JP | 2001-196639 | 7/2001 |
| JP | 2001-210872 | 8/2001 |
| JP | 2001-345483 | 12/2001 |
| JP | 2002-353504 | 12/2002 |
| JP | 2004-056075 | 2/2004 |

* cited by examiner

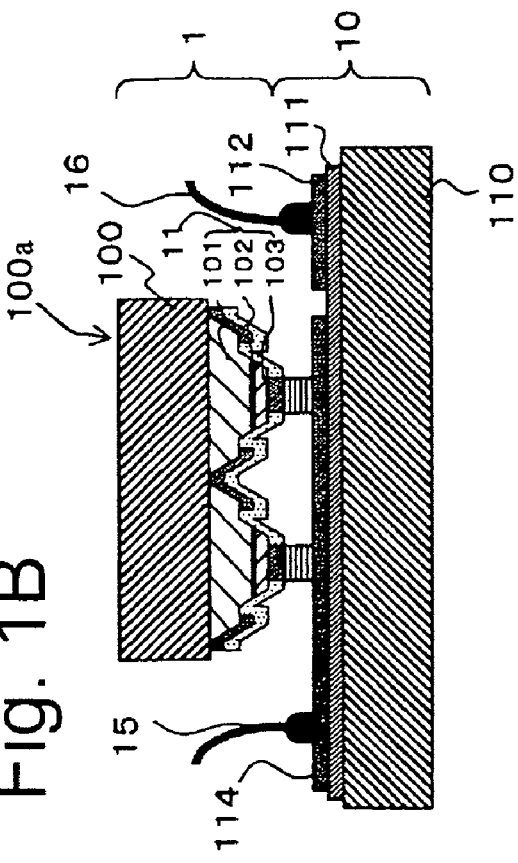
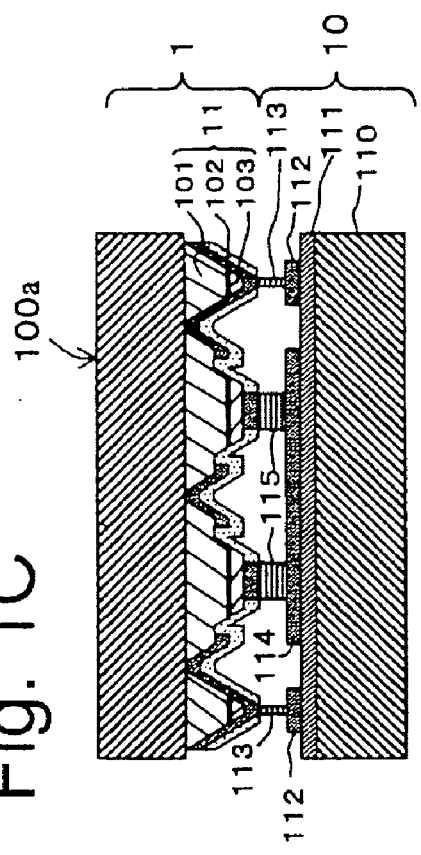
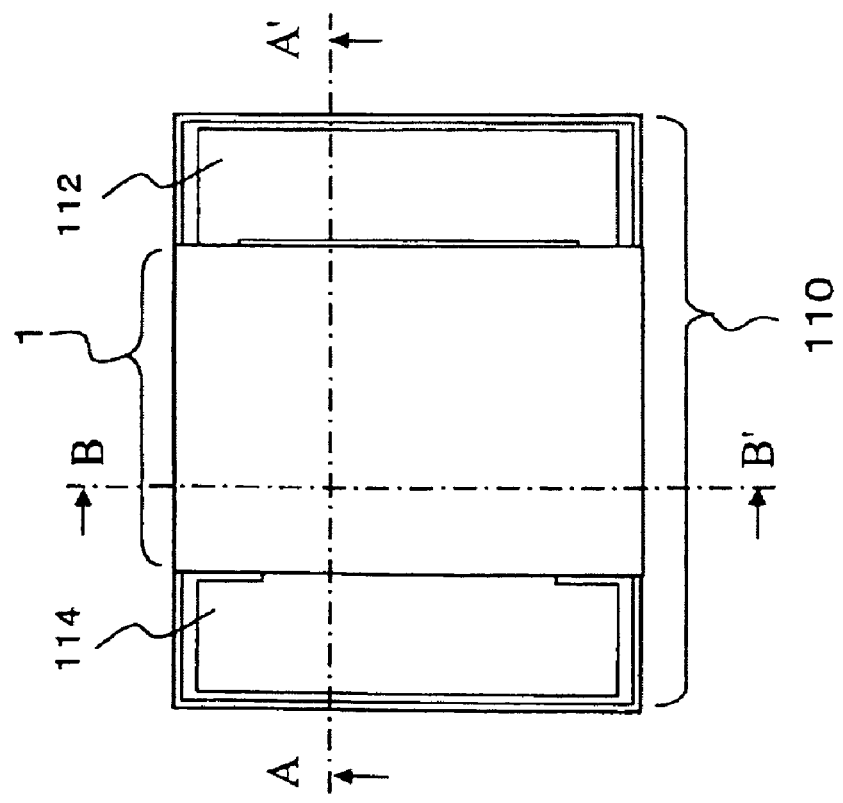

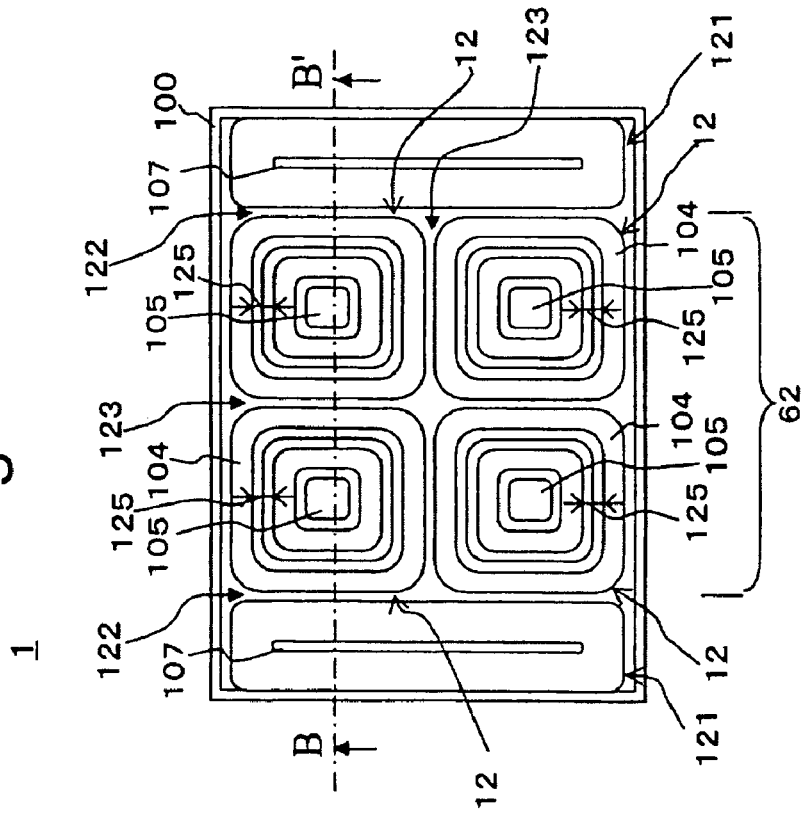

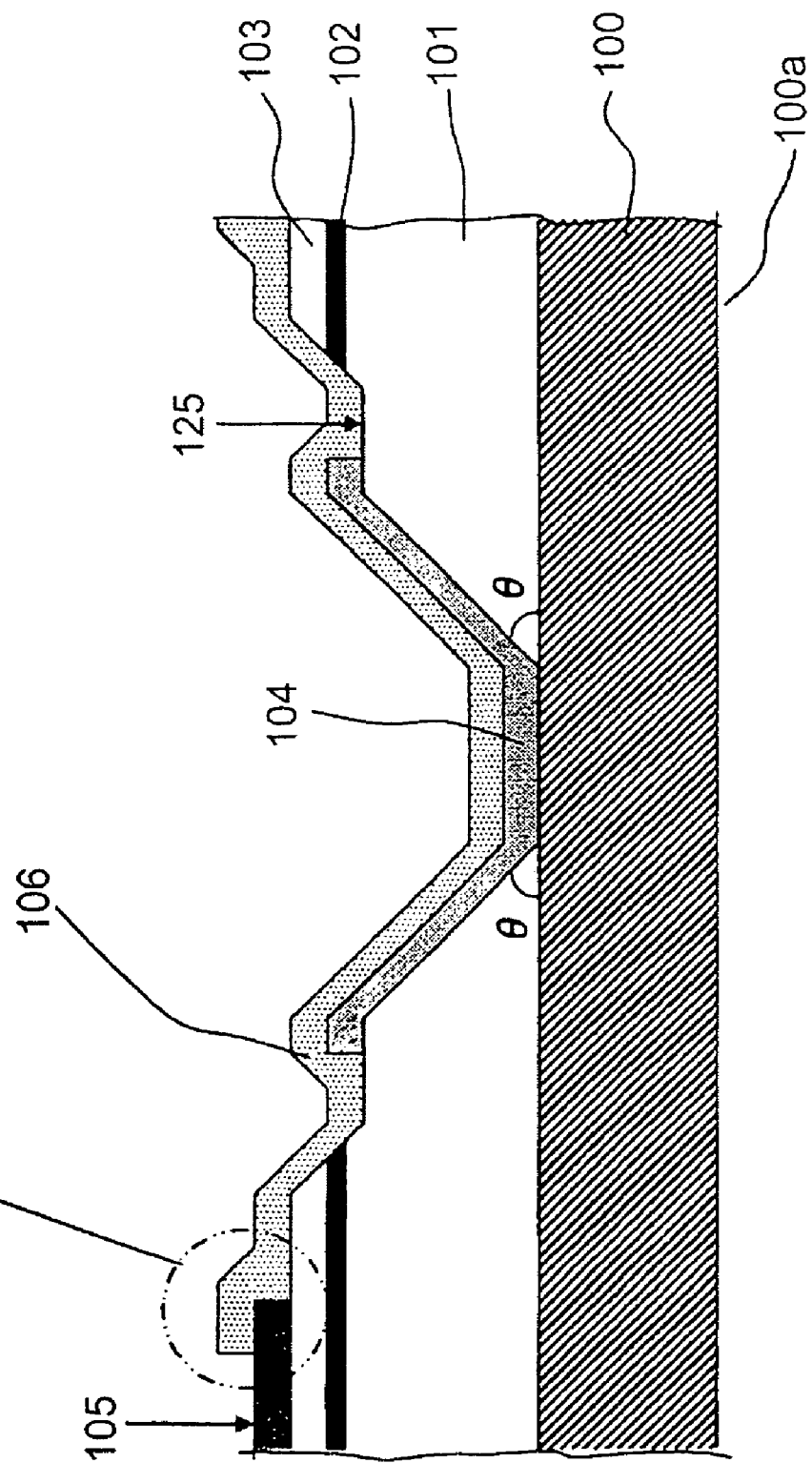

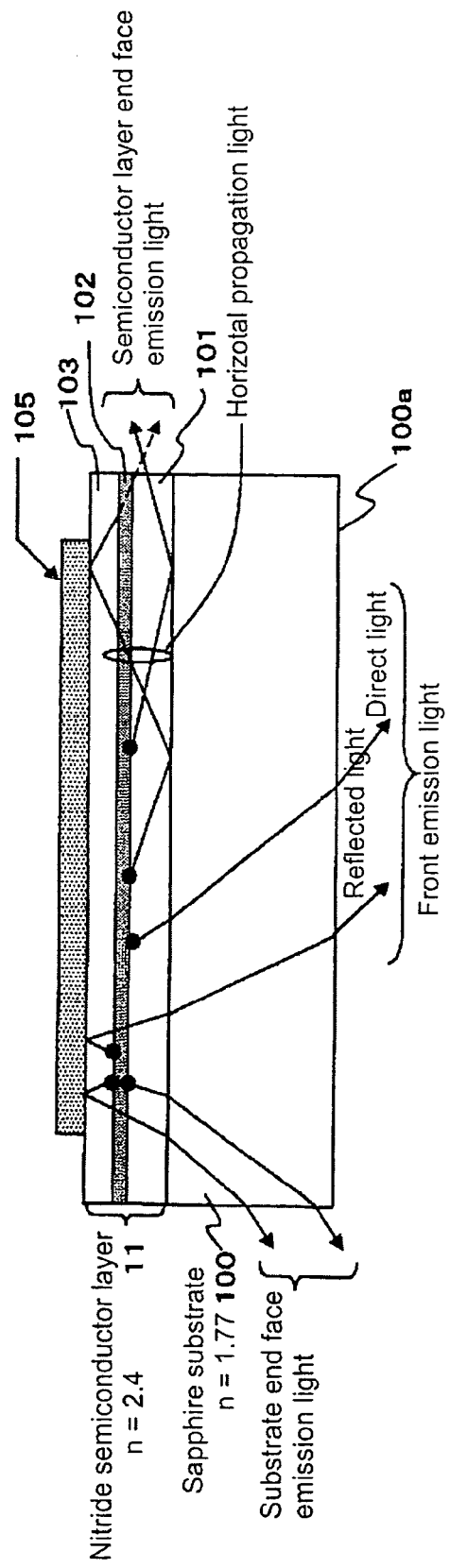

$I \text{ (luminous flux)} = 2\pi(1-\cos\theta)/2\pi \cdot 100$

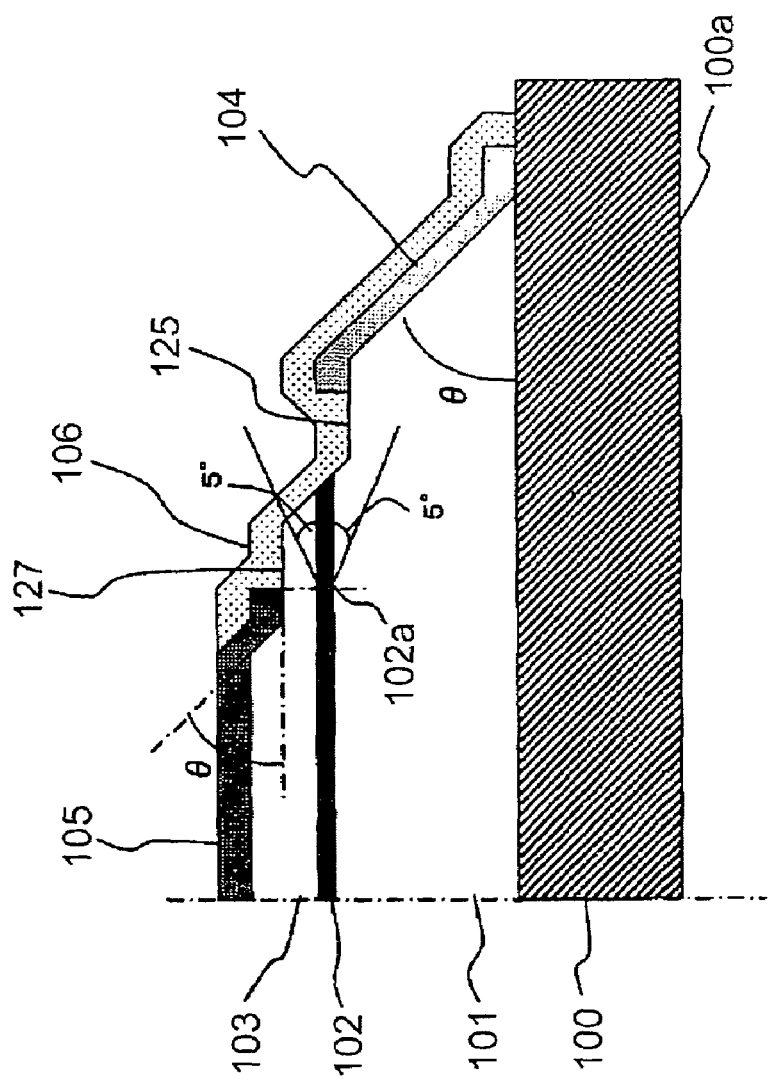

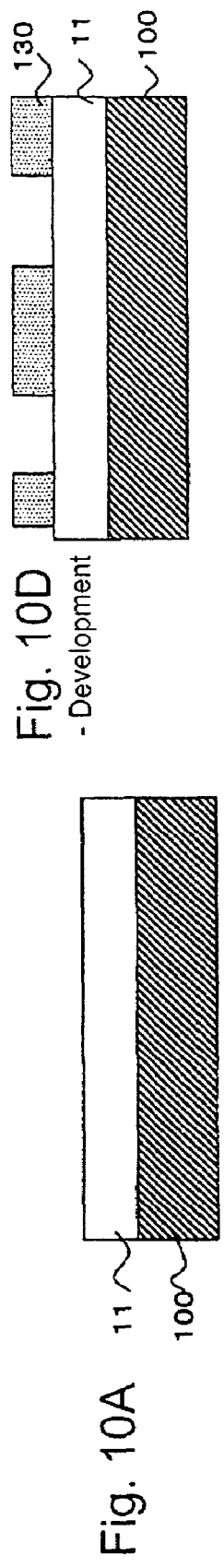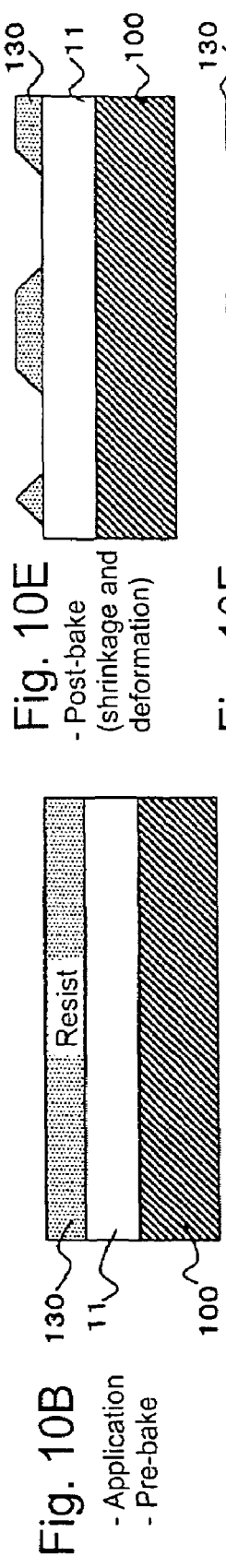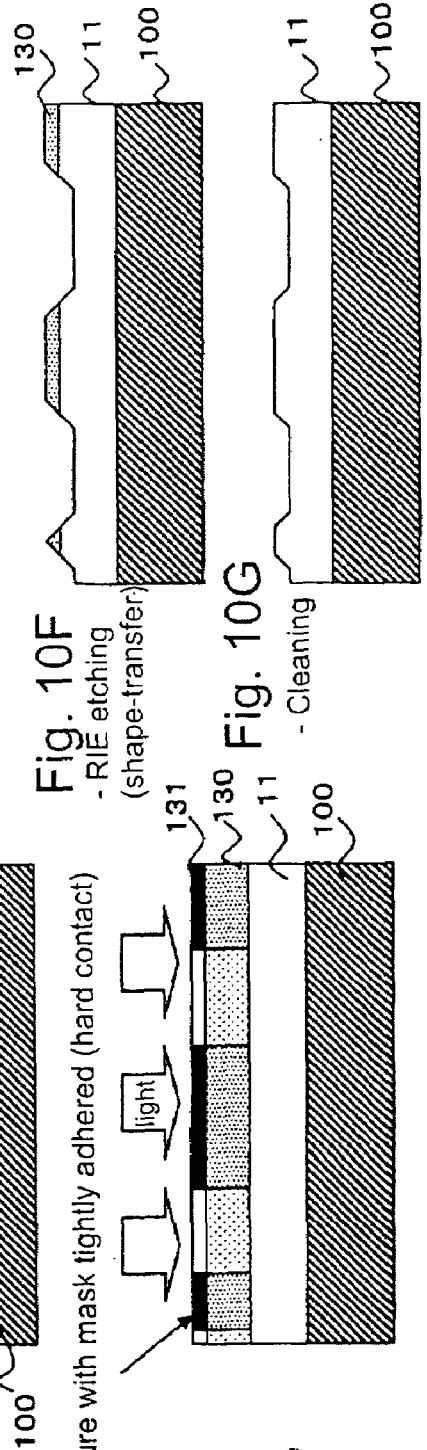

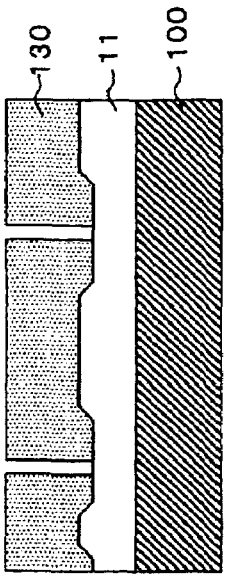
Fig. 12A
- Substrate of Fig. 10G
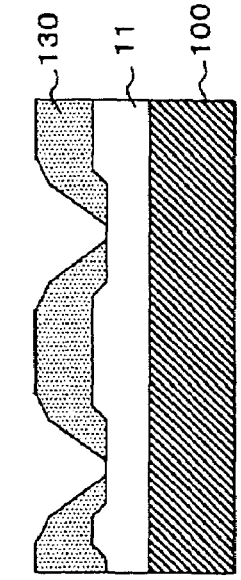
Fig. 12B
- Application
- Pre-bake
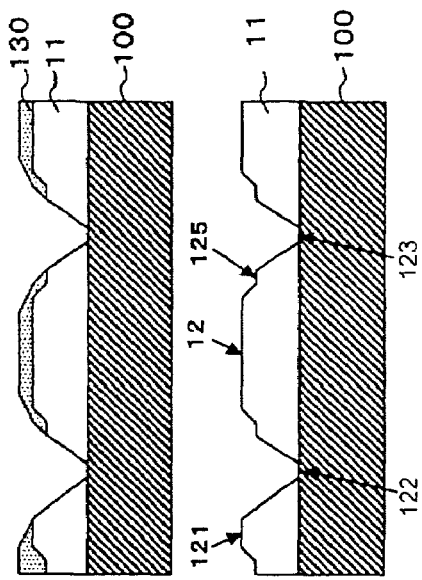
Fig. 12C
- Exposure
- PEB
Fig. 12D
- Development
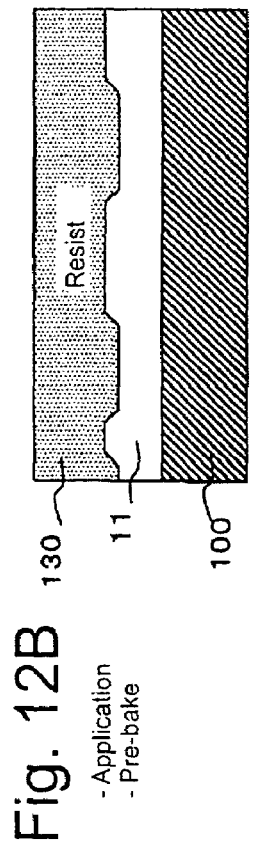
Fig. 12E
- Post bake (shrinkage and deformation)
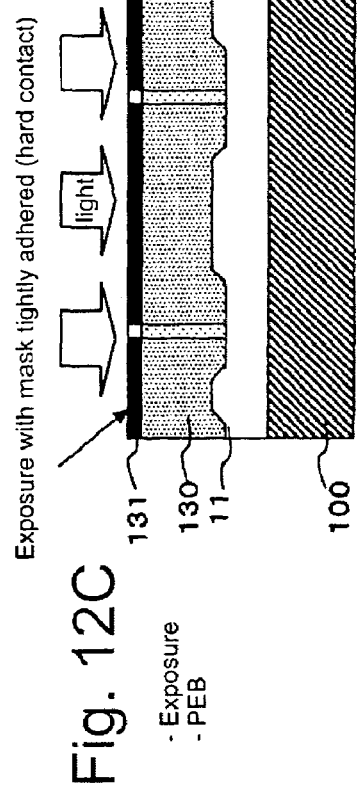
Fig. 12F
- RIE etching (shape-transfer)
Fig. 12G
- Cleaning

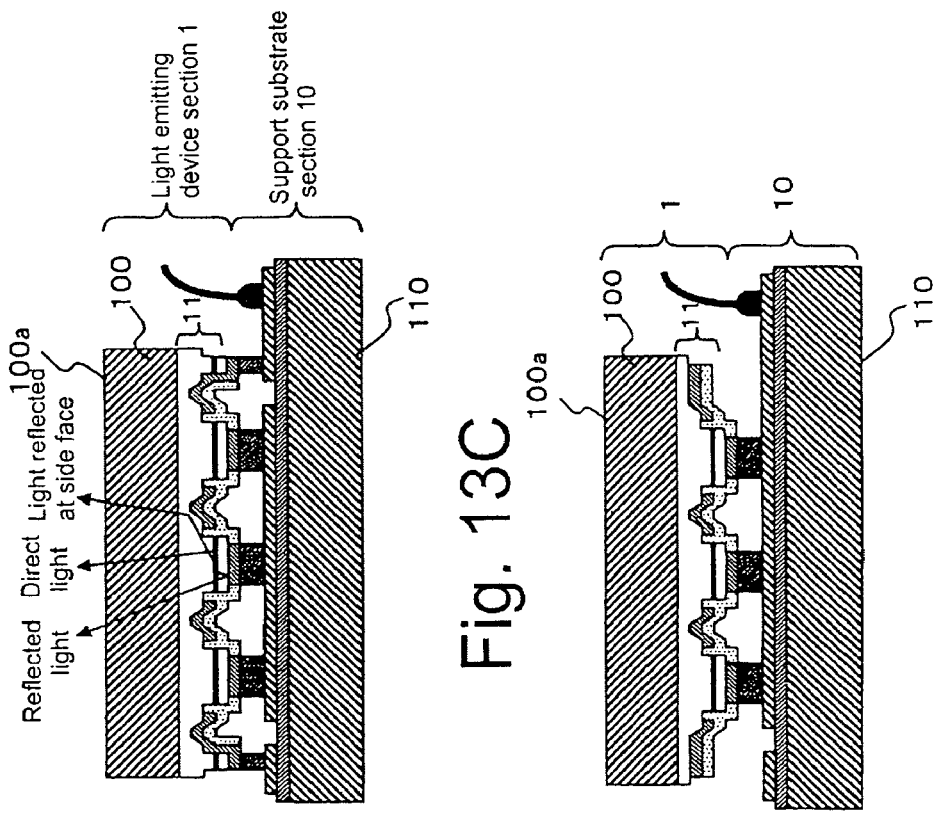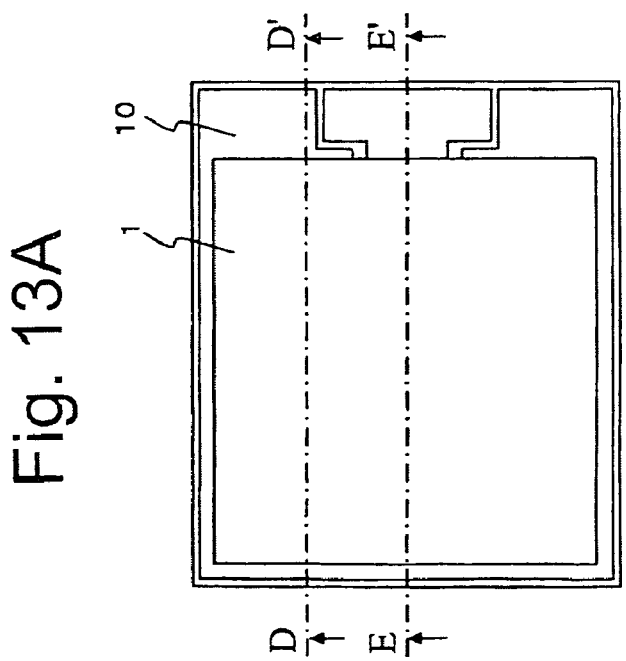

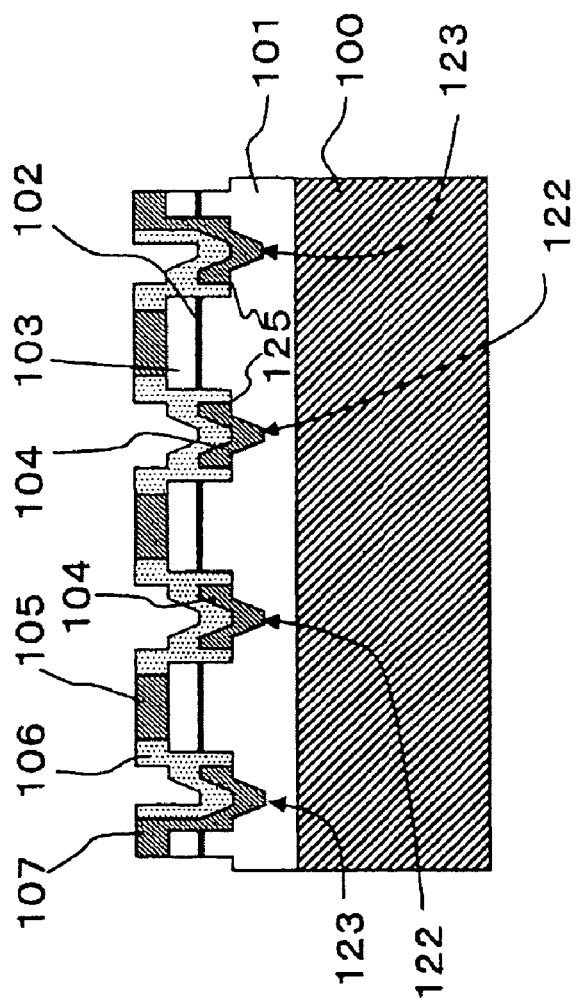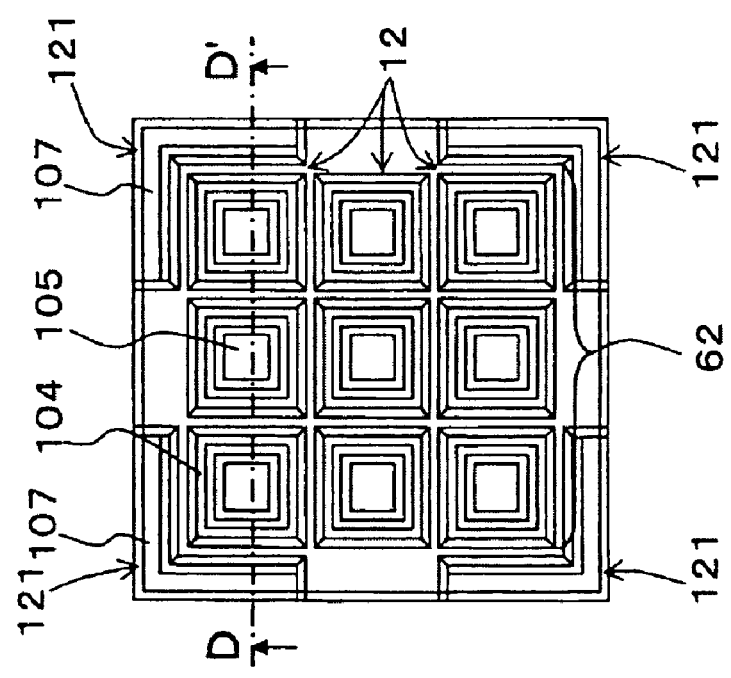

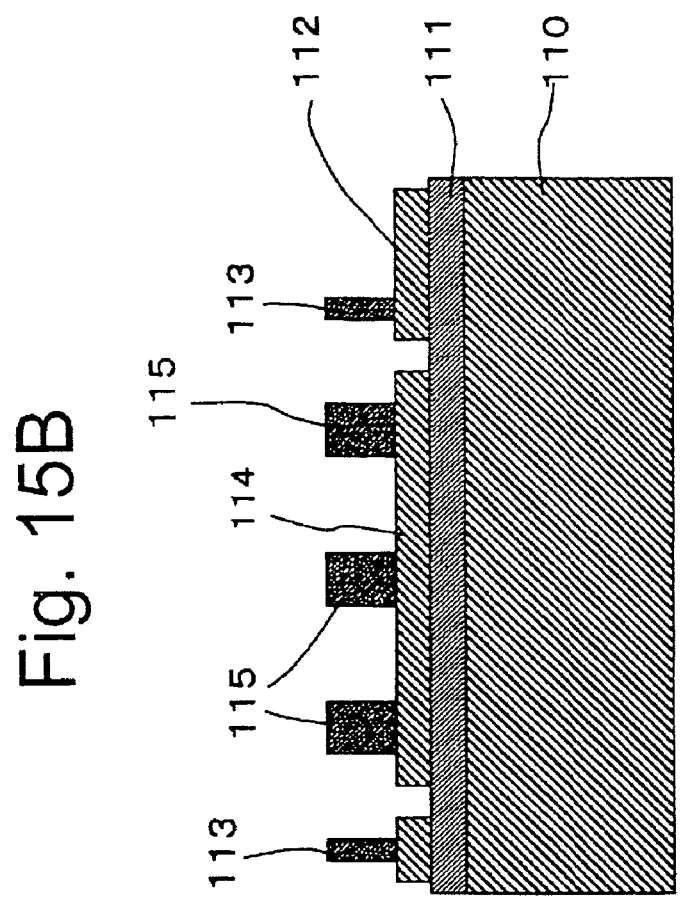
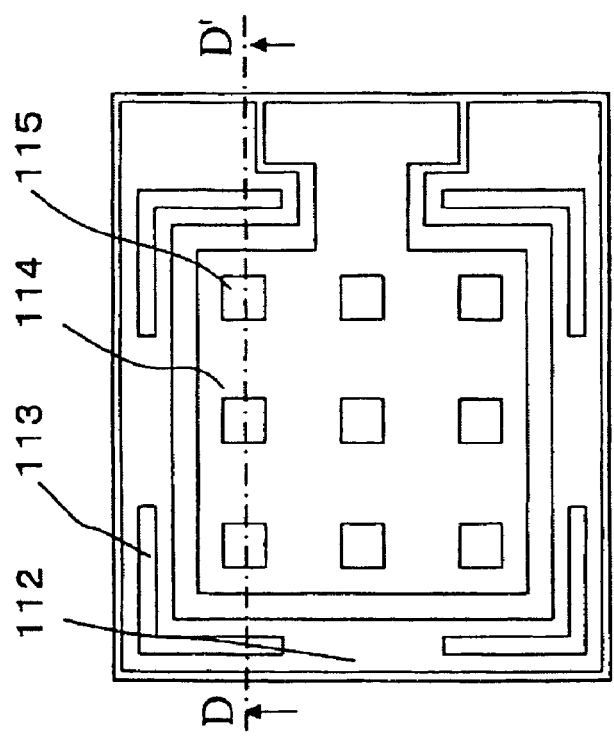

Fig. 16

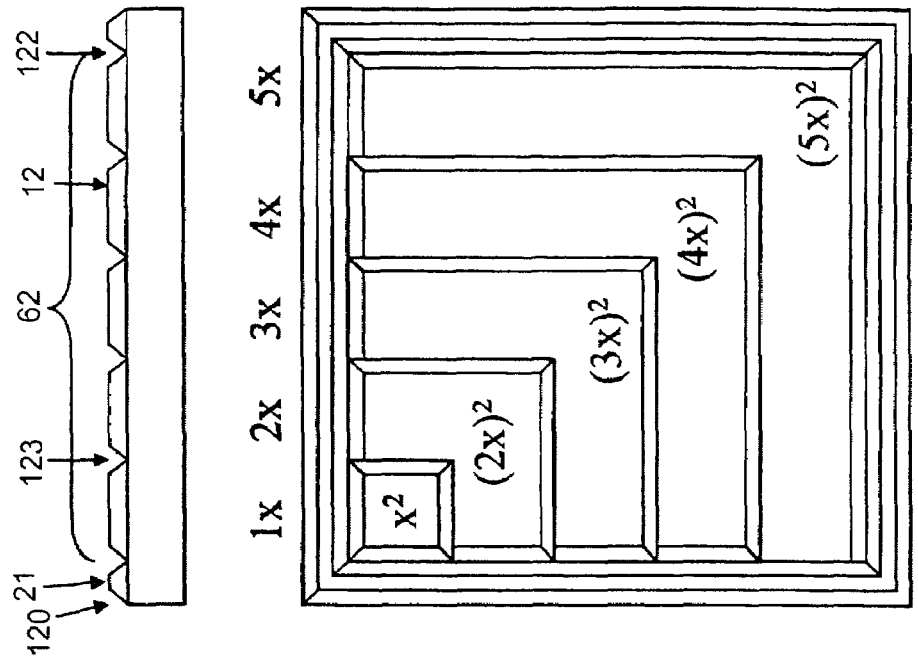

Side and area of
light emitting device region 62

| Rate of increase | Length of one side | Length of four side | Area | Length of sides/area |
|---|---|---|---|---|
| 1 | 1x | 4x | $1x^2$ | $4x/(1x)^2$ |
| 2 | 2x | 8x | $(2x)^2$ | $8x/(2x)^2$ |
| 3 | 3x | 12x | $(3x)^2$ | $12x/(3x)^2$ |
| 4 | 4x | 16x | $(4x)^2$ | $16x/(4x)^2$ |
| 5 | 5x | 20x | $(5x)^2$ | $20x/(5x)^2$ |
| n | nx | 4nx | $(nx)^2$ | $4/nx$ | x: length of unit side
nx: length of one side

When 1 is substituted into the length x of unit side,
4/nx becomes 4/n. Then, 4/n is multiplied by 1/4
for standardization.
$4/n * 1/4 = 1/n$ ... expression 1

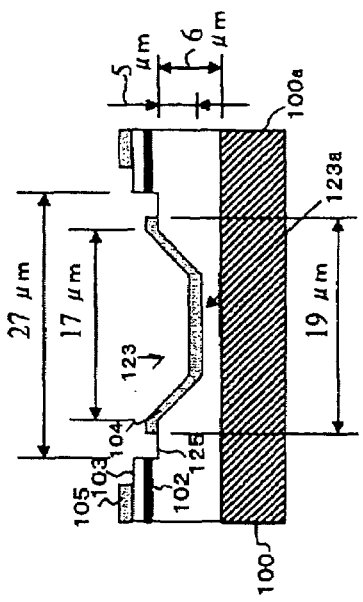
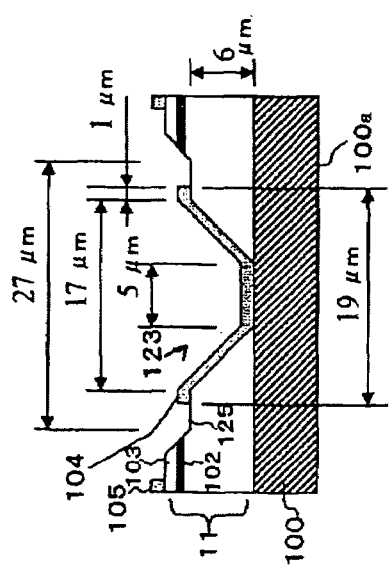

Fig. 19

| Structure | Fig. 18A | Fig. 18A | Fig. 18A | Fig. 18B | Fig. 18C |
|---|---|---|---|---|---|
| Partition number | 1 x 1 | 3 x 3 | 5 x 5 | 5 x 5 | 5 x 5 |
| Number of RIE | 2 | 2 | 2 | 2 | 1 |
| Length of cross section of electrode (μm) | 18 | 18 | 18 | 23.1 | 19 |
| Vf (V) | 3.2 | 3.2 | 3.2 | 3.2 | 3.2 |
| Reflection by end face | Exist | Exist | Exist | Exist | Not exist |
| Output (%) | 103 | 109 | 115 | 115 | 100 |

SEMICONDUCTOR LIGHT EMITTING DEVICE AND MANUFACTURING METHOD THEREOF

This application claims the priorities benefit under 35 U.S.C. §119 of Japanese Patent Application No. 2004-180915 filed on Jun. 18, 2004, which is hereby incorporated by reference.

BACKGROUND OF THE INVENTION

1. Field of the Invention

The invention relates to a semiconductor light emitting device for emitting light on the side of a substrate, and a method for manufacturing the semiconductor light emitting device.

2. Description of the Related Art

There are at least two types of semiconductor light emitting devices. One is a semiconductor light emitting device which emits light from the side of a semiconductor layer laminated on a substrate, and the other is a reflective type of light emitting device (hereinafter referred to as "flip chip") which emits light on the side of the substrate.

The light emitting device for emitting light from the side of the semiconductor layer uses a translucent electrode as an electrode on the semiconductor layer. Light from a luminescent layer is emitted to the outside through the translucent electrode. According to this structure, the transmittance of the translucent electrode is 70 to 80% at the maximum, and hence light output loss is large.

A frame, a stem, a heat sink, a wiring board, and the like are bonded on the substrate, but the thermal conductivity of the substrate is not high. Taking a case of a sapphire substrate, for example, the thermal conductivity is approximately 40 W/(m·K). Accordingly, there is a problem that when a large current is applied for high power output, heat generation causes reduction in the performance of the device (and device module), causes acceleration of degradation thereof, causes breakage thereof, and the like.

The flip chip, on the other hand, uses a substrate which is transparent with respect to emitted light, and includes a material with high reflectivity (such as Ag) as a p-type ohmic electrode on a semiconductor layer. According to this structure, light is emitted from a luminescent layer, and the portion of that light that is emitted to the side of the substrate passes through the transparent substrate. Light emitted to the side of the p-type ohmic electrode is reflected by the electrode and is emitted from the surface of the substrate. A sapphire substrate, for example, hardly has absorption loss when the emitted light is blue light, so that the sapphire substrate is applicable to the flip chip. The side of the semiconductor layer is bonded to a frame, a stem, a submount, a heat sink, a wiring board, and the like. Thus, the flip chip is superior in point of heat dissipation, so that it is possible to apply a large current for high power output.

Such a flip chip is described in Japanese Patent Laid-Open Publication No. Hei 11-330559, which discloses a flip chip in which an end face of a device is an inclined surface and an n-type electrode is disposed on the inclined surface, in order to reflect part of light that is emitted from a luminescent layer in the direction of the end face of the device towards the direction of the surface of the substrate. Accordingly, not only light that is emitted from the luminescent layer in the direction of the surface of the substrate, but also part of the light that is emitted in the direction of the end face can be emitted from the surface of the substrate, so that emission intensity is increased.

Japanese Patent Laid-Open Publication No. 2002-353504 discloses the structure of a flip chip in which a semiconductor layer takes the shape of a mesa, and a mesa wall is covered with a dielectric with high reflectivity in order to reflect light emitted in the direction of an end face towards the direction of the surface of a substrate.

To reflect light in a desired direction by an inclined end face, it is helpful to precisely form the inclination angle of the end face of a device into a desired angle. In Japanese Patent Laid-Open Publication No. Hei 11-330559, the end face of the semiconductor layer is formed into a desired inclination angle by etching with the use of a resist mask, the end face of which is formed into an inclined shape. The publication, however, does not describe in detail how to incline the end face of the resist mask to the desired angle. Neither of the above-noted references describes a method for controlling the angle of the mesa wall in detail. A method in which a photomask is slightly floated from the resist layer during the exposure of the resist layer is generally known as a method for forming a resist mask having an inclined end face. According to this method, since light at a pattern edge of the photomask goes out of focus, the exposure intensity of a resist in the direction of depth is inclined. Thus, an end portion of the resist takes an inclined shape after development.

In the structure described in Japanese Patent Laid-Open Publication No. Hei 11-330559, the n-type electrode is disposed on the inclined surface of the end face of the device. Since contact between the luminescent layer and the n-type electrode causes short circuiting, the n-type electrode on the inclined surface has to be disposed at a distance away from the end face of the luminescent layer. To increase the amount of light reflected by the n-type electrode, on the other hand, it is helpful to cover the inclined surface of the n-type semiconductor layer having a thickness of several μm with the n-type electrode as widely as possible. To satisfy both of them at the same time, it is desired to bring an end portion of the n-type electrode near to the end face of the luminescent layer to a distance of 1 μm or less. It is difficult, however, to make the distance between the n-type electrode and the end face of the luminescent layer 5 μm or less by a photolithographic technology using a mask aligner, which is generally used in the manufacture of the light emitting device. Using a stepper makes it possible to make the distance 1 μm or less, but manufacturing costs increase. When the distance is 1 μm or less, there is a possibility that dust and a burr occurring in a process after that cause the short circuiting. When difference in a lattice constant between the substrate and the semiconductor layer is large (for example, a combination of a sapphire C-plane substrate and a gallium nitride semiconductor layer), or difference in a thermal expansion coefficient is large, warpage occurs in the substrate. Thus, it is difficult to transfer a mask pattern with high precision of 1 μm or less even if a stepper is used. Furthermore, depending on a material of the electrode, electromigration during use or electrochemical migration may cause the short circuiting, when the end portion of the n-type electrode is brought near to the end face of the luminescent layer to a distance of 1 μm or less. As described above, it is difficult to efficiently reflect light emitted towards the direction of the end face by the n-type electrode on the inclined surface, and maintain electric characteristics.

In the structure described in Japanese Patent Laid-Open Publication No. 2002-353504, on the other hand, since the dielectric with high reflectivity covers the mesa wall, the short circuiting does not occur between the end face of the luminescent layer and the n-type electrode. The reflectivity of the dielectric, however, depends on the incident angle and wavelength of light. Thus, it is difficult to reflect light emitted towards the direction of the end face, the incident angle and wavelength of which expand, with high efficiency like a metal electrode.

To reflect light to a desired direction by the inclined end face, as described in both of the above-referenced publications, it is helpful to precisely form the inclination angle of the end face of the device into a desired angle. The publications do not describe such a method. The method in which the photomask is floated from the resist layer during exposure is easy and convenient. If the offset position (distance that is to be floated from the resist layer) of the photomask is misaligned, a blurry region of light largely varies, and hence there is a problem that an inclination width and the inclination angle largely vary. Since the amount of exposure in the blurry region of light increases and decreases in accordance with the length of exposure time, effective exposure distance in a resist film varies, so that the depth of the formed inclined surface varies. The depth of the inclined surface also varies in accordance with the thickness of the resist. Therefore, it was difficult to form the inclined surface which can precisely reflect light to a desired direction.

SUMMARY OF THE INVENTION

In accordance with one aspect of the invention, a semiconductor light emitting device can have stable electric characteristics, and can emit light with high intensity from the surface of a substrate.

The semiconductor light emitting device can have at least a first conductive type semiconductor layer, a luminescent layer, and a second conductive type semiconductor layer which are laminated in this order from the side of a substrate. An end face of the first conductive type semiconductor layer can include a first terrace approximately in parallel with the surface of the substrate, and an inclined end face region disposed nearer to the substrate than the first terrace. A reflective first electrode can be disposed in the inclined end face region. Since the first terrace is provided, it is possible to maintain a relatively large distance between the first electrode and the luminescent layer in a direction approximately in parallel with the surface of the substrate, and to bring the first electrode near to the luminescent layer in the direction of thickness. Thus, it is possible to reflect most of the light propagating towards the end face through a semiconductor layer to the substrate. Therefore, it is possible to increase the intensity of light taken out of the substrate.

The first terrace can be disposed in a region within 5 degrees with respect to a line passing through a center of the luminescent layer in the thickness direction in cross section and parallel to the substrate from a point as a center to the side of the first conductive type semiconductor layer. The point is an intersection of the line passing through the center of the luminescent layer in the thickness direction in cross section and parallel to the substrate, and a line extending from the end of the second electrode, perpendicular to the substrate. The intensity of propagation light traveling in this region is weak, so that the disposition of the first terrace has no effect on the intensity of reflected light.

The first terrace may be disposed in a range within 0.3 μm from the luminescent layer in the thickness direction. This is because the intensity of propagation light traveling in this range is weak.

The first electrode may be disposed so as to cover an area from the vicinity of a boundary between the first terrace and the inclined end face region to the whole inclined end face. Accordingly, it is possible to increase the amount of reflected light.

A width of the first terrace in a direction parallel with the substrate may be 5 μm or more. Accordingly, it is possible to prevent short circuiting, and to manufacture the semiconductor light emitting device by a conventional technology using a mask aligner, so that the semiconductor light emitting device can be easily manufactured. An inclination angle of the inclined end face region may be set between 35 degrees and 50 degrees with respect to the surface of the substrate. Thus, of the propagation light that propagates through the semiconductor layer, the propagation light that has high intensity can be reflected.

At least one second terrace which is approximately parallel with the surface of the substrate may be further disposed in the inclined end face region between the first terrace and the substrate. When a contact layer with high impurity concentration is included inside the first conductive type semiconductor layer, providing at least one second terrace in that position makes it possible to obtain sufficient ohmic contact of the first electrode.

When the second conductive type semiconductor layer is thick, an end face of the second conductive type semiconductor layer may be inclined to reflect light emitted from the end face to the substrate. In this case, a third terrace which is approximately parallel with the surface of the substrate may be disposed in the end face, and the end face of the second conductive type semiconductor layer farther from the substrate than the third terrace may be inclined. Providing the third terrace makes it possible to keep a long distance between the second electrode and the luminescent layer in the direction approximately in parallel with the surface of the substrate, and bring the second electrode near to the luminescent layer in the direction of thickness.

The third terrace can be disposed in a region over 5 degrees with respect to a line passing through a center of the luminescent layer in the thickness direction in cross section and parallel to the substrate from a point as a center to the side of the second conductive type semiconductor layer. The point is an intersection of the line passing through the center of the luminescent layer in the thickness direction in cross section and parallel to the substrate, and a line extending from the end of the second electrode, perpendicular to the substrate. The intensity of propagation light traveling in this region is weak, so that the disposition of the third terrace has little or no effect on the intensity of reflected light. The third terrace may be disposed in a range within 0.3 μm from the luminescent layer in the direction of thickness. This is because the intensity of propagation light traveling in this range is weak. The width of the third terrace in the direction in parallel with the substrate may be 5 μm or more. Accordingly, it becomes possible to prevent short circuiting, and to easily manufacture the semiconductor light emitting device by a conventional technology using a mask aligner.

The end face of the semiconductor layer in a region from the surface of the second conductive type semiconductor layer to the first terrace may be approximately vertical to the surface of the substrate, or may be inclined with respect to the surface of the substrate. If the foregoing region is approximately vertical to the surface of the substrate, it is possible to simplify a manufacturing process, and there is little effect on the intensity of emission light from the rear face of the substrate.

To achieve the foregoing, in a semiconductor light emitting device according to a second aspect of the present invention, a semiconductor layer can be divided into a plurality of partitions by partition grooves. An end face of a first conductive type semiconductor layer on the side of a substrate can include an inclined end face region to reflect light emitted from a luminescent layer to the substrate. A reflective first electrode can be disposed in the inclined end face region. Partitioning makes it possible to shorten the propagation distance of light propagating through the semiconductor layer in a direction to the surface, and to reflect propagation light with high intensity and the small amount of attenuation by the inclined end face and take it out. A first terrace, which is approximately in parallel with the surface of the substrate, may be provided in the end face of the first conductive type semiconductor layer. The inclined end face region can be disposed nearer to the substrate than the first terrace. Since the first terrace is provided, it is possible to keep a long distance between the first electrode and the luminescent layer in a direction approximately in parallel with the surface of the substrate, and to bring the first electrode near to the luminescent layer in the direction of thickness. Thus, it is possible to reflect most of light propagating to the end face through the semiconductor layer to the substrate.

The disposition and shape of the first terrace, and the covering range of the first electrode may be the same as those of the first terrace in the semiconductor light emitting device according to the first aspect. The second terrace and/or the third terrace described in the first aspect may be provided. Furthermore, the end face of the semiconductor layer in a region from the surface of a second conductive type semiconductor layer to the first terrace may be either approximately vertical or inclined with respect to the surface of the substrate.

The partition groove may have such a depth as to reach the substrate. Otherwise, the partition groove may have such a depth as not to reach the substrate. When the partition groove does not reach the substrate, the depth of the partition groove can be 70% or more of a depth from the first terrace to the substrate. A corner of the partition may be rounded. The radius of curvature of the rounded corner may be 0.03 to 0.1 times the length of a shorter side of the partition. A region having a predetermined shape is provided in a portion of intersection of the partition grooves where the first electrode is not disposed. This region is available as an alignment mark. Furthermore, the inclined end face region of the first conductive type semiconductor layer may have two or more different inclination angles. In this case, since light taken out to the side of the substrate is dispersed, it is possible to reduce unevenness in the intensity of light to be taken out.

When the number of the partition grooves is increased, and the size of the divided individual partition is reduced, it is possible to reduce the amount of attenuation of propagation light. The first electrode, on the other hand, needs a certain degree of width. Thus, if the size of the partition is reduced, the size (die size) of the whole light emitting device contrarily becomes large. Thus, the number of the semiconductor light emitting devices made out of a single wafer with the same size would be reduced, so that manufacturing costs would be higher. Accordingly, in consideration of these facts, an appropriate minimum partition size can be 0.0036 mm². The larger the partition size is, the lower the takeout effect of propagation light becomes. Therefore, the appropriate partition size is up to approximately 0.09 mm².

A further aspect of the present invention includes a method for manufacturing a semiconductor light emitting device which can form a semiconductor layer with an inclined end face. This manufacturing method can include a first step of applying a positive resist on a semiconductor layer to form a resist layer, allowing a photomask with a predetermined pattern to be tightly contact with the resist layer, and carrying out exposure and development. The method can include a second step of subjecting the developed resist layer to a heat treatment in a predetermined condition to shrink the top face of the resist layer, thereby forming the resist layer with an inclined end face at a predetermined angle. The method can include a third step of subjecting the semiconductor layer to dry etching by use of the resist layer with the inclined end face as an etching mask to form a concave section an end face of which is inclined at a predetermined angle. According to this method, it is possible to reproducibly incline the end face of the resist layer at the predetermined angle by setting the condition of the heat treatment in the second step. Accordingly, since the dry etching is carried out by use of the resist layer as a mask, it is possible to incline the end face of the semiconductor layer at the predetermined angle.

After the exposure in the foregoing first step, a heat treatment may be carried out in a predetermined condition. Thus, it is possible to fix the resist layer in an unexposed portion to the semiconductor layer. The dry etching may be carried out a plurality of times in the third step. Thus, it is possible to carry out etching with high precision. If the dry etching is carried out a plurality of times with changing the condition of the dry etching, it is possible to form the concave section the inclination angle of which varies in accordance with depth.

BRIEF DESCRIPTION OF THE DRAWINGS.

These and other advantages of the present invention will become clear from the following description with reference to the accompanying drawings, wherein:

FIG. 1A is a top plan view of an embodiment of a semiconductor light emitting device made in accordance with the principles of the invention, FIG. 1B is a cross sectional view taken along the line A-A' of FIG. 1A, and FIG. 1C is a cross sectional view taken along the line B-B' of FIG. 1A;

FIG. 2A is a plan view of a light emitting device section of the semiconductor light emitting device of FIGS. 1A-C, and FIG. 2B is a cross sectional view taken along the line B-B' of FIG. 2A;

FIG. 3 is an enlarged view of a portion of FIG. 2B;

FIG. 5 is an explanatory view showing the path of light in a light emitting device of FIGS. 1A-C;

FIG. 9 is a cross sectional view showing structure in which a third terrace is provided in the end face of the p-type nitride semiconductor layer, when the p-type nitride semiconductor layer of the light emitting device of FIGS. 1A-C is thick;

FIGS. 10A to 10G are explanatory views which show processes of forming the inclined end faces of the light emitting device of FIGS. 1A-C in a depth from the surface to the terrace by use of an inclined resist layer;

FIGS. 12A to 12G are explanatory views which show processes of forming the inclined end faces of the light emitting device of FIGS. 1A-C at a depth to the substrate by use of an inclined resist layer;

FIG. 13A is a top plan view of another embodiment of a semiconductor light emitting device made in accordance with the principles of the invention, FIG. 13B is a cross sectional view taken along the line D-D' of FIG. 13A, and FIG. 13C is a cross sectional view taken along the line E-E' of FIG. 13A;

FIG. 14A is a plan view of the light emitting device of FIGS. 13A-C, and FIG. 14B is a cross sectional view taken along the line D-D' of FIG. 14A;

FIG. 15A is a plan view of a support substrate section of the semiconductor light emitting device of FIGS. 13A-C, and FIG. 15B is a cross sectional view taken along the line D-D' of FIG. 15A;

FIG. 16 is an explanatory view which shows the length of a side with respect to an area, when the area of a light emitting device region is increased in the light emitting device of FIGS. 13A-C;

FIGS. 18A and 18B are cross sectional views showing examples for the shape of the light emitting device section of FIGS. 13A-C, and FIG. 18C is a cross sectional view showing a light emitting device section according to a comparative example;

FIG. 19 is a table showing the intensity of output from the light emitting devices of FIGS. 18A to 18C.

DETAILED DESCRIPTION OF PREFERRED EMBODIMENTS

Figure 4A:
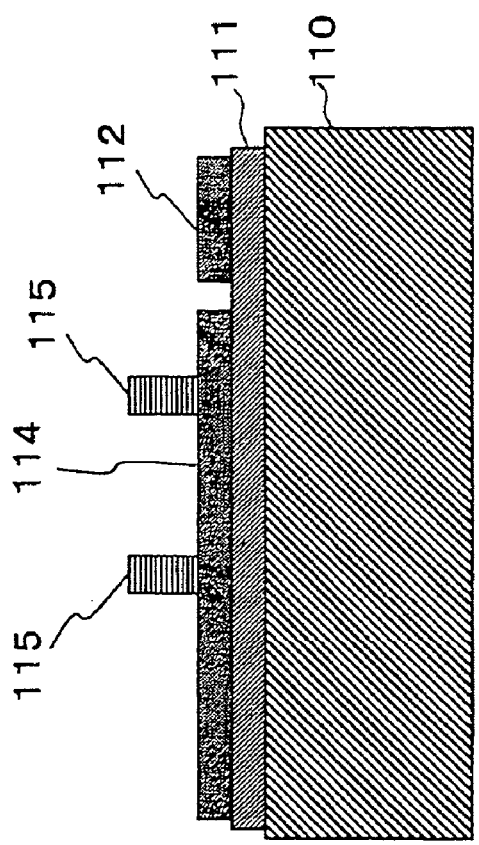
FIG. 4A is a plan view of a support substrate section of the semiconductor light emitting device of FIGS. 1A-C.

Some exemplary embodiments of the present invention will be hereinafter described.

An embodiment of a semiconductor light emitting device made in accordance with the principles of the invention, as shown in FIGS. 1A to 1C, is a flip chip in which a light emitting device section 1 can be mounted on a support substrate section 10.

The structure of the light emitting device section 1 will be described. FIGS. 2A and 2B show the detailed structure of the light emitting device section 1. The light emitting device section 1 can include a sapphire substrate 100, a nitride semiconductor layer 11, electrodes 104 and 105, and a protective film 106. The nitride semiconductor layer 11 includes at least an n-type nitride semiconductor layer 101, a luminescent layer 102, and a p-type nitride semiconductor layer 103 which can be laminated in this order on the sapphire substrate 100. In this example, the nitride semiconductor layer 11 is designed so as to have an emission wavelength of 460 nm. The light emitting device section 1 is mounted on the support substrate section 10 with the nitride semiconductor layer 11 facing toward the support substrate section 10. Light from the luminescent layer 102 is emitted from the rear face (emission surface) 100a of the sapphire substrate 100.

The thickness of the whole nitride semiconductor layer 11 can be 3 μm to 10 μm, and the total thickness of the p-type nitride semiconductor layer 103 and the luminescent layer 102 can be 0.1 μm to 0.4 μm. The thickness of the n-type nitride semiconductor layer 101 can be 2.6 μm to 9.9 μm. The nitride semiconductor layer 11 may have a buffer layer disposed between the sapphire substrate 100 and the n-type nitride semiconductor layer 101, and/or a high concentration doped layer (contact layer) for obtaining ohmic contact with the electrodes, in addition to these three layers.

Referring to FIGS. 2A and 2B, for example, the nitride semiconductor layer 11 is partitioned into a light emitting device region 62 and external frames 121 by partition grooves 122 which reach the top face of the sapphire substrate 100. The light emitting device region 62 is partitioned into four light emitting devices 12 arranged 2×2 by partition grooves 123 which reach the top face of the sapphire substrate 100. The external frame 121 is a region serving as a base of an n-type electrode pad 107 which is electrically connected to the support substrate section 10. A pair of the external frames 121 is disposed so as to interpose the four light emitting devices 12.

In this embodiment, as shown in FIG. 3, end faces of the light emitting device 12 in all directions are inclined with respect to the principal plane of the substrate 100 at a predetermined angle θ. This is for the purpose of reflecting light, emitted from the luminescent layer 102 and propagating to the direction of the end face, to the principal plane of the substrate 100 by the high reflective n-type ohmic electrode 104, which is disposed on the end face of the n-type nitride semiconductor layer 101. Thus, propagation light from the luminescent layer 102 to the direction of the end face is emitted from the rear face 100a of the substrate 100 and an end face of the substrate 100. As a result, it is possible to increase the emission output of the semiconductor light emitting device, because reflected light is emitted from the substrate 100.

A terrace 125 can be provided in the inclined end face of the light emitting device 12 (refer to FIG. 3). The terrace 125, being an end face of the n-type nitride semiconductor layer 101, is provided in a predetermined position away from the luminescent layer 102. The surface of the terrace 125 is in parallel with the surface of the substrate 100. The n-type ohmic electrode 104 can be disposed so as to cover the end face nearer the substrate 100 than the terrace 125. Since the terrace 125 is provided in this manner, it is possible to keep a large distance between the n-type ohmic electrode 104 and the end face of the luminescent layer 102 in a direction approximately in parallel with the surface of the substrate, and to shorten a distance in the direction of thickness of the layer. Therefore, the electrode 104 can cover most of the end face of the n-type nitride semiconductor layer 101 with sufficiently securing a clearance. Accordingly, it is possible to reflect most of emission light to the direction of the end face to the emission surface 100a, and to prevent short circuiting between the n-type ohmic electrode 104 and the luminescent layer 102. Therefore, it is possible to easily manufacture the flip chip with high power output, and to prevent the short circuiting due to electromigration during use and electrochemical migration occurring in the existence of moisture, so that the reliability of the device is improved.

Referring to FIG. 2B, for example, the external frame 121 is covered with an electrode layer continuous from the n-type ohmic electrode 104, and an uppermost electrode layer of the external frame 121 in the shape of a pedestal is used as the n-type electrode pad 107. The p-type ohmic electrode 105 in a predetermined size is mounted on the top face of the p-type nitride semiconductor layer 103 of the light emitting device 12. The protective film 106 covers the end faces of the semiconductor layer 11 and the top faces of the n-type ohmic electrode 104 on the whole, except for the top faces of the p-type ohmic electrodes 105 and the top faces of the n-type electrode pads 107. The protective film 106 is made of a material with low wettability with respect to connection member layers 113 and 115 of the support substrate section 10.

Next, an example of the structure of the support substrate section 10 will be described by use of FIGS. 4A and 4B. In this example, the support substrate section 10 has a silicon substrate 110, an insulating film 111 covering the whole surface of the silicon substrate 110, and an n-type lead electrode layer 112 and a p-type lead electrode layer 114 which are disposed on the insulating film 111. The n-type lead electrode layer 112 is disposed so as to include a region opposite to the n-type electrode pads 107 when the light emitting device section 1 is mounted, and the p-type lead electrode layer 114 is disposed so as to include a region opposite to the p-type ohmic electrodes 105 of the light emitting device section 1. The connection member layers 113 and 115 are disposed in the region of the n-type lead electrode layer 112 opposite to the n-type electrode pads 107 and the region of the p-type lead electrode layer 114 opposite to the p-type ohmic electrodes 105, respectively. In this example, each of the connection member layers 113 and 115 is formed out of a predetermined metal multilayer film for eutectic bonding before bonding. The connection member layers 113 and 115 are eutectically bonded to the n-type electrode pads 107 and the p-type ohmic electrodes 105, respectively.

A frame, a wiring board, a heat sink, a stem, and the like can be bonded on the rear face of the silicon substrate 110 of the support substrate section 10 by an adhesive. The n-type lead electrode layer 112 and the p-type lead electrode layer 114 are connected to the wiring board through wire bonding 15 and 16 (refer to the example shown in FIG. 1B).

In this example, the n-type lead electrode layer 112 is connected to the n-type ohmic electrode 104 through the connection member layer 113 and the n-type electrode pads 107. The p-type lead electrode layer 114, on the other hand, is connected to the p-type ohmic electrodes 105 through the connection member layer 115. Accordingly, a drive voltage is applied to the semiconductor layer 11, and hence light is emitted from the luminescent layer 102.

An example of a possible emission path for light will be described with reference to FIG. 5. FIG. 5 shows a case in which the end faces of the light emitting device 12 are vertical in all directions with respect to the surface of the substrate 100. There are three emission paths. Namely, emission light is classified into substrate surface emission light (front emission light), substrate end face emission light, and semiconductor layer end face emission light. The substrate surface emission light (front emission light) is emitted through the rear face (emission surface) 100a of the sapphire substrate 100 directly from the luminescent layer 102 or by being reflected by the p-type ohmic electrode 105. The substrate end face emission light is emitted through the end face of the substrate 100. The semiconductor layer end face emission light is emitted through the end face of the nitride semiconductor layer 11. The refractive index of the nitride semiconductor layer 11 (approximately 2.4) is larger than the refractive index of the sapphire substrate 100 (approximately 1.77). Thus, most of light emitted from the luminescent layer 102 is totally reflected by an interface between the p-type ohmic electrode 105 and the nitride semiconductor layer 11, and an interface between the nitride semiconductor layer 11 and the sapphire substrate 100, and becomes horizontal propagation light which propagates through the nitride semiconductor layer 11. The horizontal propagation light becomes the semiconductor layer end face emission light, when the end face of the light emission device 12 is vertical. Accordingly, in this embodiment, the end face of the light emitting device 12 is inclined at an inclination angle θ, and the inclined end face is covered with the electrode 104, in order to reflect the semiconductor layer end face emission light to the rear face (emission surface) 100a of the substrate 100.

The inclination angle θ of the end face is designed as follows, to reflect the end face emission light as much as possible.

Figure 6:
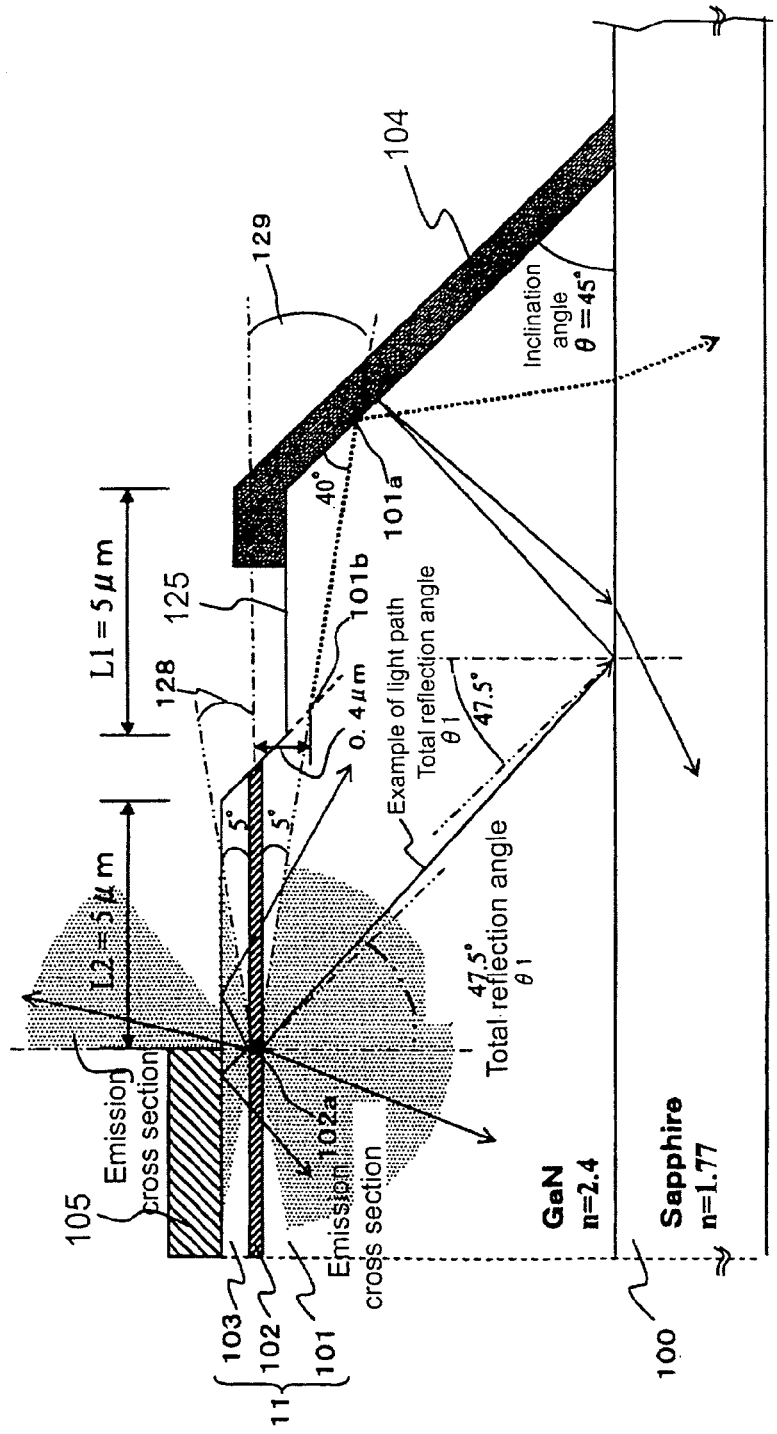
FIG. 6 is an explanatory view which explains the inclination structure of an end face of a light emitting device section and the disposition of an n-type ohmic electrode for the light emitting device of FIGS. 1A-C.
Figure 7:
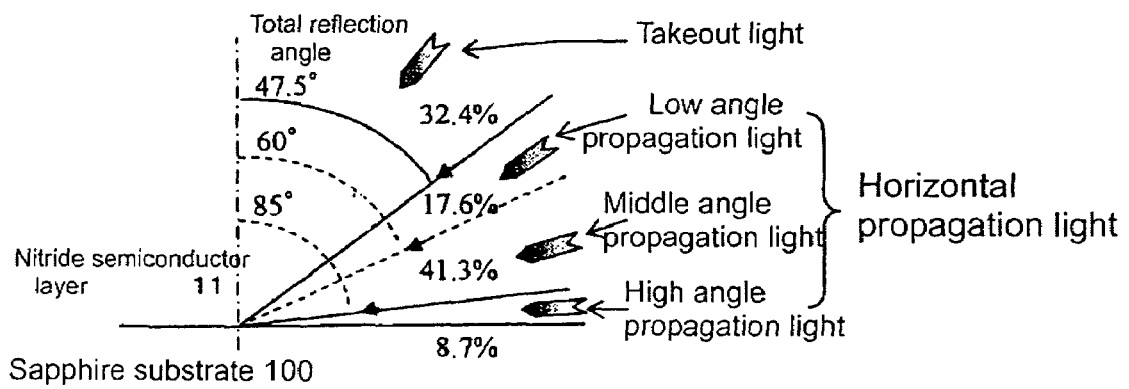
FIG. 7 is a graph showing the types of horizontal propagation light and the ratio thereof in the light emitting device of FIGS. 1A-C.

When the emission wavelength of the luminescent layer 102 is approximately 460 nm, the refractive index of the nitride semiconductor layer 11 is approximately 2.4, and the refractive index of the sapphire substrate 100 is approximately 1.77. Thus, as shown in FIG. 6, Γ1=approximately 47.5 degrees, when θ1 represents the total reflection angle of the interface of the sapphire substrate 100 viewed from' the side of the nitride semiconductor layer 11. At this time, assuming that the reflectivity of the p-type ohmic electrode 105 is 100% and the absorption by the nitride semiconductor layer 11 is 0%, it is assumed that light is emitted from a certain point 102a in the luminescent layer 102 to all directions in three dimensions with equal intensity. In this case, as shown in FIG. 7, it is calculated that light penetrating through the sapphire substrate 100 is approximately 32.4% of the whole emission light, and light reflected by the interface of the sapphire substrate 100 is approximately 67.6%. The reflected light becomes the horizontal propagation light which horizontally propagates through the nitride semiconductor layer 11.

The horizontal propagation light propagates while being reflected by the interface (reflecting surface) between the p-type nitride semiconductor layer 103 and the p-type ohmic electrode 105, and the interface (reflecting surface) between the sapphire substrate 100 and the nitride semiconductor layer 11. The horizontal propagation light passes through the luminescent layer 102 during propagation. Thus, the horizontal propagation light attenuates due to reflection loss in the reflecting surfaces (interfaces), absorption in the luminescent layer 102, and absorption in a buffer layer when the buffer layer is disposed between the substrate 100 and the nitride semiconductor layer 11. The propagation light also attenuates due to the non-radiative center, crystal defect, and the like of a crystal itself composing the nitride semiconductor layer 11. Accordingly, propagation light which reflects many times with respect to propagation distance tends to attenuate, and propagation light which reflects fewer times does not tend to attenuate. Even if propagation light reflects fewer times, the propagation light which is incident at an angle approximately in parallel with the luminescent layer 102 (at a large incident angle) substantially penetrates through a large thickness (passes through a long distance) of the luminescent layer 102, so that the propagation light heavily attenuates. Therefore, of the horizontal propagation light, both the low angle propagation light and the high angle propagation light are weakened in their intensity because they tend to attenuate. The low angle light can include the light for which the incident angle upon the reflecting surface (interface) is between 47.5 degrees (total reflection angle) and 60 degrees. The high angle propagation light can include the light for which the incident angle is 85 degrees or more. Middle angle propagation light for which the incident angle is larger than 60 degrees and smaller than 85 degrees does not attenuate as much, and becomes propagation light with high intensity (refer to FIG. 7).

Accordingly, it is sometimes preferable that the inclination angle θ of the end face of the nitride semiconductor layer 11 (refer to FIGS. 3 and 6) should be set so that the foregoing middle angle propagation light is emitted through the rear face (emission surface) 100*a* of the sapphire substrate 100 in the case of being reflected by the n-type ohmic electrode 104 on the end face. It is also sometimes preferable that the inclination angle θ should be set so that the middle angle propagation light is incident upon the reflecting surface, which is formed by the n-type ohmic electrode 104 and the end face of the n-type nitride semiconductor layer 101, at a slightly large angle from a region divided by a line normal to the reflecting surface on a side opposite to the sapphire substrate 100. If the reflecting surfaces which are formed by the n-type ohmic electrode 104 and the end face of the n-type nitride semiconductor layer 101 are slightly rough, or have an angle slightly deviating from a predetermined inclination angle, the propagation light can be incident on the side of sapphire. Thus, it is also sometimes preferable that the inclination angle of the end face be set at 35 degrees to 50 degrees with respect to the surface of the sapphire substrate 100. The inclination angle of the end face can also be set at 40 degrees to 45 degrees, in order to emit the foregoing middle angle propagation light from the rear face 100*a* of the substrate 100 at an angle approximately orthogonal to the surface of the substrate.

Next, a range in which the n-type ohmic electrode 104 covers the end face of the nitride semiconductor layer 11 will be described.

In the nitride semiconductor layer 11, since the electric conductivity of the p-type nitride semiconductor layer 103 is low, light is emitted from only part of the luminescent layer 102 directly below the p-type ohmic electrode 105. When the p-type ohmic electrode 105 is formed by photolithography using a mask aligner, a clearance L2 of approximately 5 μm is helpful, as shown in FIG. 6, wherein L2 represents the clearance from the end face of the luminescent layer 102 to the end face of the p-type ohmic electrode 105. Thus, the luminescent layer 102 having a width of approximately 5 μm positioned outside of the p-type ohmic electrode 105 does not emit light, but functions as an absorption layer of the horizontal propagation light. The luminescent layer 102 especially tends to absorb the high angle propagation light, which is incident upon the luminescent layer 102 at an incident angle of 85 degrees or more, so that emission light is weakened. As with the horizontal propagation light, the periphery of the luminescent layer 102 with a width of approximately 5 μm, which functions as the absorption layer, also absorbs emission light from the luminescent layer 102 itself. Thus, the intensity of emission light is weak within a range of approximately 5 degrees on both sides of the p-type nitride semiconductor layer 103 and the n-type nitride semiconductor layer 101 with respect to the surface of the luminescent layer 102.

Therefore, as shown in FIG. 6, a region 128 from a center point 102*a* of the luminescent layer 102 in the direction of thickness, which is directly below the end face of the p-type ohmic electrode 105, within an angle of approximately 5 degrees on the side of the p-type nitride semiconductor layer 103 with respect to the center plane of the luminescent layer 102, and a region 129 from the center point 102*a* within an angle of 5 degrees on the side of the n-type nitride semiconductor layer 101 are regions in which the intensity of traveling light is weak. Even if the light is not reflected by the n-type ohmic electrode 104, the light has little effect on the light intensity of the emission surface 100*a*. Accordingly, the n-type ohmic electrode 104 just has to cover a section of the inclined end face from an outermost position 101*a* on an inclined end face of the region 129 with low light intensity to the sapphire substrate 100. The thickness of the p-type nitride semiconductor layer 103 is generally between 0.3 μm and 0.4 μm, and extremely thin. Thus, in most cases, the end face of the p-type nitride semiconductor layer 103 is inside the region 128 with low light intensity. Accordingly, when the p-type nitride semiconductor layer 103 is thin, there is no effect on the light intensity of the emission surface 100*a* even if the end face of the p-type nitride semiconductor layer 103 is not covered with a reflective electrode. By covering only the inclined end face of the n-type nitride semiconductor layer 101 with the n-type ohmic electrode 104, it is possible to efficiently take out the horizontal propagation light from the rear face (emission surface) 100*a* of the sapphire substrate 100.

Next, the terrace 125 will be described. If the terrace 125 is not provided, the end face of the n-type nitride semiconductor layer 101 is positioned on an extension of the end face of the luminescent layer 102. In that case, an outermost position 101*b* of the region 129 with low light intensity gets near to the luminescent layer 102 in the end face. Taking a case where the clearance L2 of the p-type ohmic electrode 105 is 5 μm as shown in FIG. 6, for example, a distance between the position 101*b* and the luminescent layer 102 is just approximately 0.4 μm. When the top end of the n-type ohmic electrode 104 is disposed in the position 101*b*, there is a possibility that a shortage of clearance between the luminescent layer 102 and the n-type ohmic electrode 104 causes short circuiting between the luminescent layer 102 and the n-type ohmic electrode 104 during manufacture by a general technology using the mask aligner, and hence an yield is reduced. Even if the device can be manufactured with a clearance of 0.4 μm, there is a possibility that electromigration during use and electrochemical migration in the existence of moisture cause the short circuiting between the luminescent layer 102 and the n-type ohmic electrode 104. Accordingly, in this embodiment, the terrace 125 which is approximately in parallel with the surface of the substrate 100 is provided, in order to keep the inclined end face of the n-type nitride semiconductor layer 101 away from the end face of the luminescent layer 102, and solve the problem of the short circuiting. Furthermore, providing the terrace 125 makes it possible to keep the luminescent layer 102 5 μm away from the n-type ohmic electrode 104 at the minimum. The luminescent layer 102 and the n-type ohmic electrode 104 do not short out if they are 3 to 4 μm away from each other. Thus, the n-type ohmic electrode 104 can be formed so as to cover part of an end portion of the terrace 125, and hence it is possible to certainly cover the inclined end face.

The terrace 125 can be precisely and easily formed by a photolithographic process using the mask aligner and a dry etching process. A terrace width L1 can be flexibly formed if the terrace width L1 is equal to or larger than a clearance (approximately 3 to 5 μm) that is helpful in the photolithographic and dry etching processes. Furthermore, it is possible to form the top end of the n-type ohmic electrode 104 in a position sufficiently away from the p-type nitride semiconductor layer 103 and the luminescent layer 102 due to the medium of the terrace. Therefore, a manufacturing yield is increased, and the short circuiting during use is prevented. It is sometimes preferable that the terrace 125 be provided inside the region 129 with low light intensity in order not to reduce the amount of emission light from the emission surface 100a of the sapphire substrate 100. To be more specific, when the clearance L2 of the p-type ohmic electrode 105 is 5 µm, the terrace 125 can be provided at a depth of approximately 0.1 to 0.3 µm from the bottom face (n-type layer side) of the luminescent layer 102.

When the whole thickness of the nitride semiconductor layer 11 is 3 µm to 10 µm, the total thickness of the p-type nitride semiconductor layer 103 and the luminescent layer 102 is 0.1 to 0.4 µm, and the top end of the n-type ohmic electrode 104 is positioned at a depth of 0.1 to 0.3 µm from the bottom face (n-type layer side) of the luminescent layer 102 as shown in the example depicted in FIG. 6, the covering rate of the end face of the nitride semiconductor layer 11 by the n-type ohmic electrode 104 reaches 80% to 97%. Accordingly, calculating from a geometric viewpoint, 80% to 97% of the horizontal propagation light can be reflected to the sapphire substrate 100. Furthermore, since an uncovered portion is in the regions 128 and 129 with low light intensity, as described above, it is presumed that even more horizontal propagation light can be reflected in actuality.

As described above, in the flip chip according to this embodiment, the end faces of the nitride semiconductor layer 11 of the light emitting device section 1 are inclined at a predetermined angle θ with respect to the surface of the substrate 100, and the terraces 125 are provided in the middle of the inclined surfaces. Therefore, it is possible to dispose the n-type ohmic electrode 104 near the luminescent layer 102 in the direction of thickness, while keeping it largely away from the luminescent layer 102 in the horizontal direction. Thus, it is possible to take out the horizontal propagation light in a wide range from the emission surface 100a of the substrate 100, and to prevent the short circuiting between the n-type ohmic electrode 104 and the luminescent layer 102. Therefore, it is possible to easily manufacture the electrically stable flip chip with high emission intensity with a high yield.

Figure 8A:
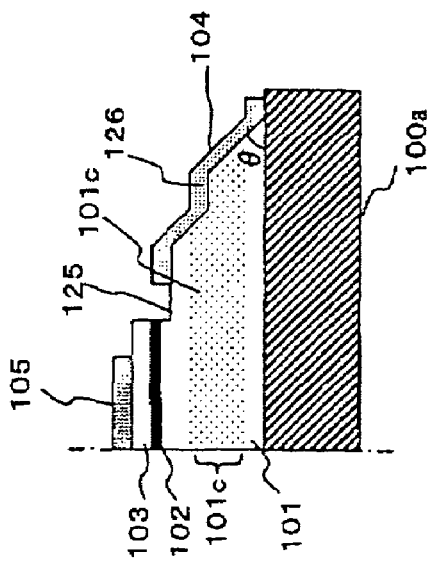
FIG. 8A is a cross sectional view of the light emitting device section of FIGS. 1A-C which shows the structure of an inclined end face of a p-type nitride semiconductor layer.
Figure 8B:
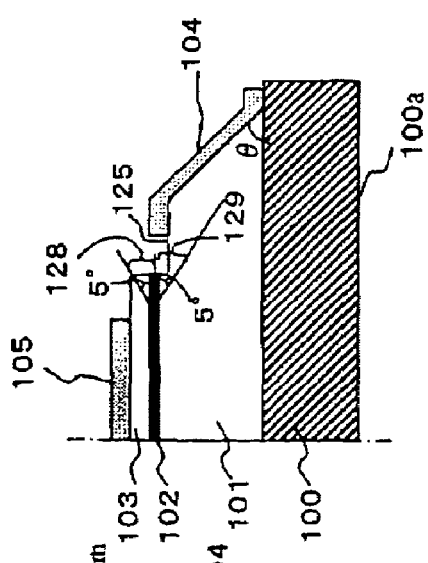
FIG. 8B is a cross sectional view which shows the structure of a vertical end face of the p-type nitride semiconductor layer.
Figure 8C:
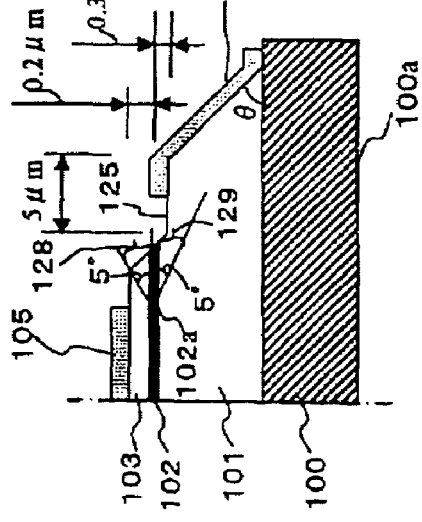
FIG. 8C is a cross sectional view showing the structure of an end face in which a second terrace is provided in a contact layer.

In the foregoing exemplary light emitting device section 1, as shown in FIGS. 1, 2B, 3, 6, and 8A, the end face of the semiconductor layer 11 from the p-type nitride semiconductor layer 103 to the terrace 125 is inclined. The structure of the end face, however, is not limited to this construction, as shown in FIG. 8B, the end face of the semiconductor layer 11 that is located above the terrace 125 may be vertically oriented. Since the intensity of propagation light is weak in the ranges 128 and 129 of ±5 degrees with respect to the surface of the luminescent layer 102, there is little effect on the intensity of light taken out of the emission surface 100a if the end face is vertical. The terrace 125 having the structure of FIG. 8B can be easily manufactured by a standard photolithographic process. Otherwise, as shown in FIG. 8C, a two-tier terrace may be provided in the end face of the n-type nitride semiconductor layer 101. The n-type nitride semiconductor layer 101 contains an n-type contact layer 101c with high impurity concentration, but there are cases where the n-type contact layer 101c is not positioned directly below the luminescent layer 102. In such a case, if a second terrace 126 is provided in the position of the n-type contact layer 101c as shown in FIG. 8C, the n-type ohmic electrode 104 can obtain favorable ohmic contact, and obtain a sufficient electrode area. Two or more second terraces 126 may be provided.

In the foregoing light emitting device section 1, since the p-type nitride semiconductor layer 103 is thin, it is unnecessary to provide a reflective electrode on the end face of the p-type nitride semiconductor layer 103. In the case where the p-type nitride semiconductor layer 103 is equal to or thicker than 0.3 µm, as shown in FIG. 9, a third terrace 127 may be provided in the end face of the p-type nitride semiconductor layer 103. The p-type ohmic electrode 105 is disposed so as to cover the inclined surface of the p-type nitride semiconductor layer 103 and an inside end portion of the third terrace 127. Accordingly, it is possible to reflect propagation light with high intensity, which reaches the end face at an angle of 5 degrees or more from the luminescent layer 102, by the p-type ohmic electrode 105, and emits the propagation light from the emission surface 100a.

A method for manufacturing the semiconductor light emitting device according to this embodiment will be described.

This embodiment provides an easy and efficient method for precisely inclining the end faces of the nitride semiconductor layer 11 at an angle θ. First, the principle of the manufacture of the inclined end faces will be described with reference to FIGS. 10A to 10G. A process of inclining the end faces of the nitride semiconductor layer 11 includes a process of forming the end face of a resist mask into an inclined shape, and a dry etching process for transferring and etching the shape of the resist mask to and on the nitride semiconductor layer. In this embodiment, a resist layer is inclined to a desired inclination angle by use of a phenomenon in which a resist shrinks in a post bake process of the resist.

To be more specific, a resist is evenly applied to the wafer-shaped substrate 100 in which the nitride semiconductor layer 11 is formed in advance by use of a spin coater. After a resist coating layer is formed, a resist layer 130 is formed by pre-baking (FIGS. 10A and 10B). In the pre-baking, temperature is lower and time is longer (for example, 90 degrees centigrade and 120 seconds) than those in a condition recommended by a maker of the used resist (for example, 100 degrees centigrade and 60 seconds). In this embodiment, a heat-resistant g-line positive resist (trade name: AZ6130, made by Clariant (Japan)K.K.) which is suitable for the dry etching process can be used.

Then, a photomask 131 for transferring a pattern and the substrate 100 with the resist layer 130 as shown in FIG. 10B are set on the mask aligner, to carry out contact exposure (hard contact) (FIG. 10C). After the exposure, post exposed bake (hereinafter abbreviated as PEB) which is not included in the conditions recommended by the maker is carried out on a condition of 110 degrees centigrade and 120 seconds. After that, development is carried out by use of a developing solution (trade name: AZ300MIF, made by Clariant(Japan)K.K.), and the resist layer 130 in exposed portions are removed (FIG. 10D). At this stage, end portions of the resist layer 130 vertically rise.

Then, post bake is carried out (FIG. 10E). By adjusting temperature and time in this post bake process, the whole resist layer 130 shrinks. Thus, it is possible to incline the end portions of the resist at an angle in accordance with a bake condition. To be more specific, the end portions of the resist layer 130 incline at an inclination angle of 55 degrees on a post bake condition of 110 degrees centigrade and 120 seconds. The inclination angle becomes 45 degrees on a post bake condition of 115 degrees centigrade and 120 seconds, and the inclination angle becomes 35 degrees on a post bake condition of 120 degrees centigrade and 120 seconds.

Then, the substrate with the resist layer 130 that has end faces which are inclined as shown in FIG. 10E is set on an RIE (reactive ion etching) device, to etch the nitride semiconductor layer 11 up to a predetermined depth by dry etching using a chlorine gas (FIG. 10F). The selection ratio of this dry etching is approximately 1, and the end faces of the nitride semiconductor layer 11 are formed into an inclination angle which is determined by the inclination angle of the resist layer 130 and the selection ratio. For example, when the selection ratio is 1, the inclined shape of the resist layer 130 is transferred to the nitride semiconductor layer 11. When the etching speed of the resist layer 130 is faster than that of the semiconductor layer 11, the inclination angle of the nitride semiconductor layer 11 with respect to the sapphire substrate 100 becomes small (shallow). When the etching speed of the resist layer 130 is slower than that of the semiconductor layer 11, the inclination angle of the nitride semiconductor layer 11 becomes large.

The resist layer 130 is removed by dissolving, and cleaned lastly. Therefore, the nitride semiconductor layer 11 is processed into a shape located above the terrace 125.

As described above, it is possible to incline the end portions of the resist layer 130 with high reproducibility at an angle corresponding to the post bake condition by controlling temperature and time of the post bake by using the phenomenon in which the resist shrinks in the post bake. Accordingly, if the relation between the post bake condition and the inclination angle on the resist to be used is determined in advance by experiment, and the post bake is carried out on the condition for obtaining a desired inclination angle, it is possible to form the resist layer 130 with the desired inclination angle. Since the pre-bake is carried out at lower temperature and for longer time than the recommended condition, it is possible to remove a solvent in the resist to the degree of having no problem in exposure. The exposure and the PEB are carried out in that state, so that the resist layer 130 in an unexposed portion and the nitride semiconductor layer 11 can tightly contact with each other. Therefore, the positions of portions in which the end faces of the resist layer 130 make contact with the semiconductor layer 11 are fixed, and hence it is possible to precisely incline the end faces by shrinkage during the post bake.

In the foregoing method for forming the resist layer 130, a contact exposure method (hard contact) is used. Thus, the pattern transfer precision of the photomask 131 is high, and a pattern is not misaligned during the exposure. A nitride semiconductor wafer laminated on a different type of substrate (sapphire) is slightly warped convexly or concavely because of difference in lattice constants (Δa) and difference in thermal expansion coefficients. However, warpage is corrected by pressing the photomask, so that the misalignment of the pattern does not occur. Furthermore, in contrast to a method with an apart photomask, the misalignment of the inclination angle due to exposure intensity and time does not occur. Furthermore, it is possible to form the inclination angle of the end portions of the resist layer with high reproducibility by only selecting the post bake condition. If the resist layer 130 is thick, the inclination angle depends on only the temperature and time of the post bake. Thus, the condition can be easily set. As to the resist layer 130 having a thickness of approximately 10 μm, it is possible to form the inclined resist layer 130 without problem.

When the temperature of the PEB is too low, the end portions of the resist sag in the exposure, and the pattern precision becomes worse. When the temperature of the PEB is too high, the resist remains in the exposed portions. An appropriate condition is approximately 105 to 120 degrees centigrade and 60 to 150 seconds. The resist layer 130 can have a thickness so that the resist layer 130 of 1 to 2 μm or more remains on the nitride semiconductor layer 11 after the dry etching process by the RIE. The selection ratio (the ratio between the etching rate of the resist mask and the etching rate of the nitride semiconductor layer) in the dry etching process can be approximately 1. If the selection ratio is largely different than 1, the inclination angle of the nitride semiconductor layer 11 becomes hard to adjust. In deeply etching the nitride semiconductor layer, there are cases where the resist mask is deformed or deteriorated due to the heat of plasma. In such a case, etching may be carried out several times. If etching is carried out several times with different etching conditions, it is possible to form an end face the inclination angle of which varies in stages. If the end face is formed with the inclination angle varying in stages or different inclination angles, it is possible to effectively reflect the low angle propagation light or propagation light through a nitride layer and the sapphire substrate too.

Next, a method for manufacturing the semiconductor light emitting device as shown in FIGS. 1A and 1B will be described by use of the foregoing manufacturing method of the inclined end face.

Figure 11A:
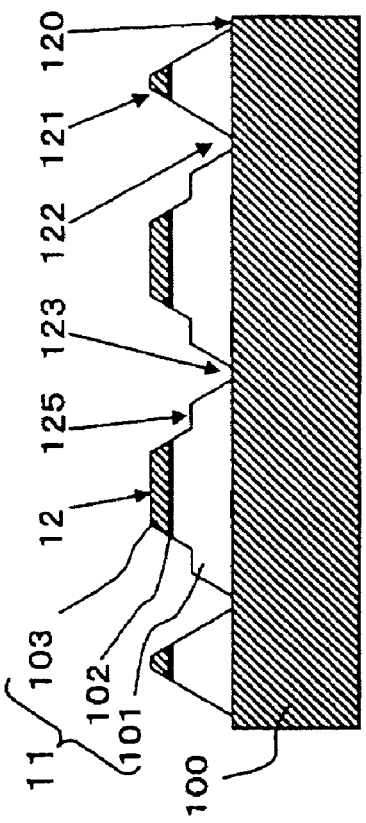
FIG. 11A is a plan view showing a state in which partition grooves reaching a substrate are formed in a nitride semiconductor layer in the manufacturing processes of the light emitting device of FIGS. 1A-C.
Figure 11B:
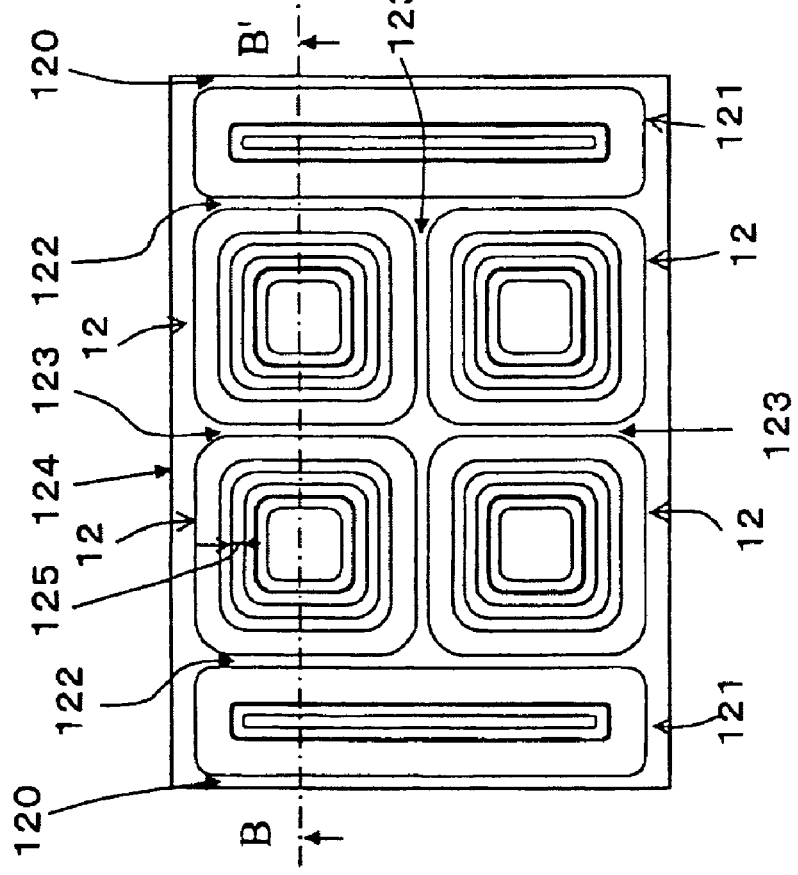
FIG. 11B is a cross sectional view thereof.

A method for manufacturing the light emitting device section 1 shown in FIGS. 2A and 2B will be first described. The wafer-shaped sapphire substrate 100 on which the nitride semiconductor layer 11 has been formed is prepared. The nitride semiconductor layer 11 can be formed by a MOVPE method (metal-organic vapor-phase epitaxial growth method), a MBE method (molecular beam epitaxial growth method), a VPE method (vapor phase epitaxial growth method), or the like. The nitride semiconductor layer 11 on the substrate 100 is divided into the four rectangular light emitting devices 12 and the external frames 121 by the grooves (partition grooves) which reach the top face of the sapphire substrate 100. The partition grooves, as shown in FIGS. 11A and 11B, include the partition grooves 123 for partitioning the light emitting device region 62 into the four light emitting devices 12, the external frame partition grooves 122 for separating the light emitting device region 62 from the external frames 121, and contour grooves 120 being borders with adjacent light emitting device sections 1 on adjacent sapphire substrates 100. The inclined end face of the light emitting device 12 is divided in two steps by the terrace 125, so that the partition grooves are also formed in two steps. In a first step, the partition grooves 123, the external frame partition grooves 122, and the contour grooves 120 are formed in a depth from a surface to the terrace 125. In a second step, each of the foregoing grooves 123, 122, and 120 is formed in a depth reaching the sapphire substrate 100.

First, portions to be the contour grooves 120, the external frame partition grooves 122, and the light emitting device region partition grooves 123 are opened by use of a photolithographic technology. A mask of a resist layer 130 in which the edges of open portions are inclined at a predetermined angle is formed by processes of FIGS. 10A to 10E. Then, the nitride semiconductor layer 11 in the open portions is etched to a predetermined depth of the terrace 125 by use of a dry etching technology. Thus, the p-type nitride semiconductor layer 103, the luminescent layer 102, and a part of the n-type nitride semiconductor layer 101 are removed (FIG. 10F). At this time, since the edges of the open portions of the mask of the resist layer 130 are inclined, the edges of the etched nitride layer 11 are inclined too. The resist is removed by cleaning (FIG. 10G), so that the contour grooves 120, the external frame partition grooves 122, and the light emitting device region partition grooves 123 are formed in such a depth as to expose the n-type nitride semiconductor layer 101.

Then, each of the partition grooves 120, 122, and 123 is made such that they reach the sapphire substrate 100 by processes of FIGS. 12A to 12G, which are similar to the processes of FIGS. 10A to 10E. At this time, openings of the photomask 131 shown in FIG. 12C are made to be small so that the terraces 125 are formed in the inclined surfaces of the light emitting device region partition grooves 123 and the inclined surfaces of the external frame partition grooves 122 on the side of the light emitting devices 12. Thus, the openings of the mask of the resist layer 130 are formed to be small for the terraces 125. Accordingly, as shown in FIG. 12G, the inclined surfaces with the terraces 125 are formed, and the nitride semiconductor layer 11 having the shape of FIGS. 11A and 11B is formed. In this embodiment, since the total thickness of the p-type nitride semiconductor layer 103 and the luminescent layer 102 is 0.35 µm, the depth of the terrace 125 is made to be 0.65 µm by adding 0.3 µm to 0.35 µm. As described above, the depth to the terrace 125 is adjusted in accordance with the structure of the lamination of a semiconductor light emitting device wafer.

Then, a resist mask which is opened in the shape of the p-type ohmic electrodes 105 is formed on the light emitting devices 12 in the structure of 2×2 by use of the photolithographic technology. Then, Pt(platinum), Rh(rhodium), Ti(titanium), Pt, Au, Pt, and Au are deposited thereon by electron-beam evaporation in a thickness of 1 nm, 100 nm, 100 nm, 100 nm, 100 nm, 100 nm, and 200 nm, respectively, in this order from the side of the semiconductor layer 11. After that, evaporated materials are removed from portions except for the openings of the mask by a lift-off method, to form the p-type ohmic electrodes 105 with high reflectivity. The lower Pt/Rh deposition film can obtain sufficient ohmic contact without alloying. Even if the Pt/Rh deposition film is alloyed, its reflectivity is hardly reduced. The upper Pt/Au/Pt/Au deposition film is designed so as to have a thickness which enables the film to be bonded with the support substrate section 10, in consideration of the warpage of the substrate 100 to be used, adhesion to the support substrate section 10, and the like. To change the total thickness of the electrode layer, the thickness of the Au layer sandwiched between the Pt layers is adjusted. To control adhesion to a connection member, the thickness of the Au layer in the surface is adjusted.

The p-type ohmic electrode 105 may have a layer structure other than that described above. The p-type ohmic electrode 105 can have a layer structure including a Pt layer, a layer structure including a Rh layer, a layer structure including a Pt/Ag deposition film, a layer structure including a Rh/Ag deposition film, or the like. The layer structure should have high reflectivity with respect to light emitted from the luminescent layer 102 and use a material ohmically connectable to the p-type nitride semiconductor 103.

A resist mask which is opened in the shape of the n-type ohmic electrodes 104 and the n-type electrode pads 107 is formed on the surfaces of the external frames 121, the external frame partition grooves, the light emitting device region partition frames 123, and the terraces 125 by using the photolithographic technology in the same manner. Then, Al(aluminum), Rh, Ti, Pt, Au, Pt, and Au are deposited thereon by electron-beam evaporation in a thickness of 3 nm, 100 nm, 100 nm, 100 nm, 100 nm, 100 nm, and 200 nm, respectively, in this order from the side of the semiconductor layer 11. After that, evaporated materials are removed from portions except for the openings of the mask by the lift-off method, to form the n-type ohmic electrodes 104 with high reflectivity and the n-type electrode pads 107. The lower Al/Rh deposition film can obtain sufficient ohmic contact without alloying, so that it is possible to prevent reduction in reflectivity by alloying. The Al layer and an Rh layer have high reflectivity. Even if the Al layer and the Rh layer are alloyed, their reflectivity is hardly reduced. Thus, it is possible to form the n-type ohmic electrodes 104 with high reflectivity. The thickness of the upper Pt/Au/Pt/Au may be adjusted from the same viewpoint as that in the case of forming the p-type ohmic electrodes 105. When, for example, the substrate 100 warps convexly with respect to the nitride semiconductor layer 11, the n-type ohmic electrode 104 is made slightly higher than the p-type ohmic electrode 105. When the substrate warps concavely, on the other hand, the n-type ohmic electrode 104 is made slightly lower than the p-type ohmic electrode 105. An Al/Pt deposition layer, an Al/Ir deposition layer, or an Al/Pd deposition layer may be used as materials of the n-type ohmic electrode 104 and the n-type electrode pad 107. Also in this case, it is possible to obtain favorable ohmic contact.

Lastly, the protective film 106 with low wettability to the connection member layers 113 and 115 of the support substrate section 10 is formed on the whole except for the p-type ohmic electrodes (also serving as p-type electrode pads) 105, and the n-type electrodes pads 107. First, a SiO$_2$ film being the protective film 106 is deposited on the whole in a thickness of 100 to 300 nm by a sputtering device. Then, a resist mask in which portions of the n-type electrode pads 107 and the p-type ohmic electrodes (also serving as the p-type electrode pads) 105 are opened is formed by use of the photolithographic technology. Then, the SiO$_2$ film is removed by wet etching to expose the electrode pads. The resist mask is removed by cleaning, so that the protective film 106 with low wettability is completed.

If Ti is deposited onto the front surface layer of the p-type ohmic electrodes 105 and the n-type ohmic electrodes 104 (including the external frames) in advance in a thickness of approximately 1 to 10 nm, adhesion to the protective film with low wettability made of SiO$_2$ is increased. Since a Ti layer is etched in wet etching the SiO$_2$ film, Ti does not remain on the surfaces of the p-type ohmic electrodes 105 and the electrode pads 107. The protective film 106 with low wettability may be made of other substances, such as Al$_2$O$_3$, TiO$_2$, ZrO$_2$, or HfO$_2$, instead of SiO$_2$. The properties, manufacturing method, and the like of the material of the protective film 106 with low wettability are appropriately selectable as long as the material has low wettability to the connection member layers 113 and 115 of the support substrate section 10.

The thickness of the wafer-shaped substrate 100 on which the protective film 106 has been formed is thinned to approximately 100 µm by grinding and polishing. Then, the substrate 100 is divided into individual light emitting devices 1 by scribing and breaking. Scribe grooves are formed on the rear surface of the sapphire substrate 100 so as to coincide with the contour grooves 120. A knife edge of a breaking device is pressed against the contour groove 120 provided in the nitride semiconductor layer, to divide the substrate 100 into the individual devices. At this time, since the contour groove 120 is inclined in the shape of the letter V, the knife edge is guided to the bottom of the V-shape groove. Accordingly, a tip of the knife edge coincides with a scribe line, so that the substrate 100 is certainly diced.

In the case of manufacturing the light emitting device section 1 in which the p-type nitride semiconductor layer 103 has the third terrace 127 as shown in FIG. 9, the third terrace 127 is formed in the processes of FIGS. 10A to 10G. Then, the processes of FIGS. 10B to 10G are carried out again to form the terrace 125. The carrier density of the p-type nitride semiconductor layer 103 in a region of the third terrace 127 is increased by the effect of chlorine plasma used in the RIE, so that electric current does not concentrate and short circuiting does not occur if the p-type nitride semiconductor layer 103 is covered with the p-type ohmic electrode 105.

Figure 4B:
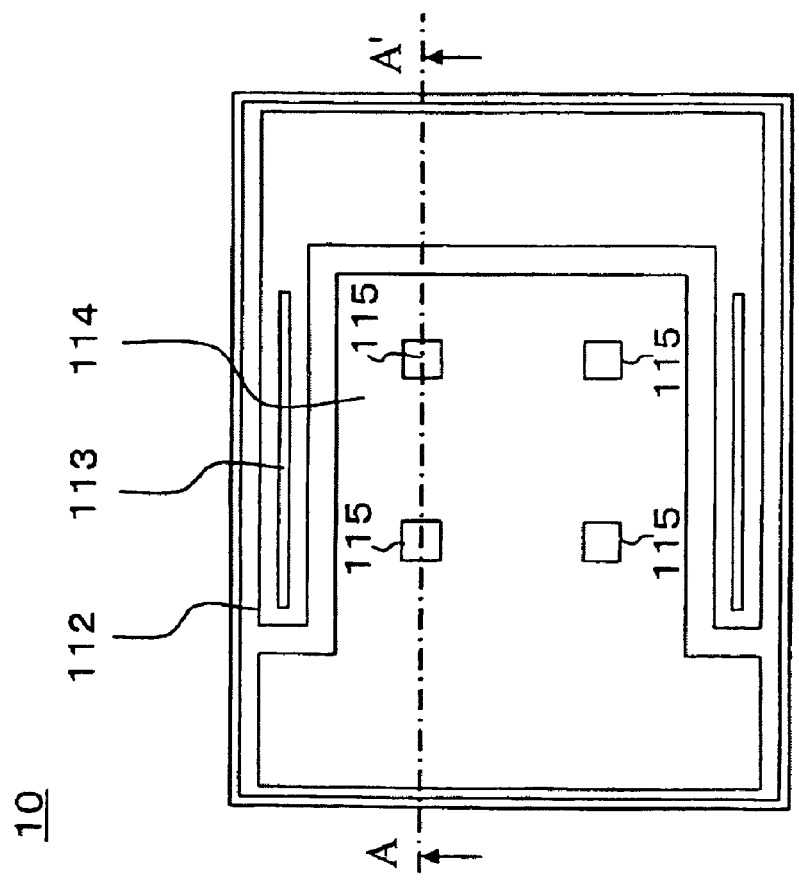
FIG. 4B is a cross sectional view taken along the line A-A' of FIG. 4A.

Next, a method for manufacturing the support substrate section 10 as shown in FIGS. 4A and 4B will be described.

First, the silicon substrate 110 is prepared. After the surface of the silicon substrate 110 is cleaned, a SiO$_2$ film is deposited to a thickness of 300 nm on the whole surface of the substrate by sputtering as the insulating film 111. Using a silicon substrate with a SiO$_2$ oxide film can omit the process of deposition. It is also possible to use an insulating substrate such as AlN, alumina, and the like as the substrate 110. In such a case, this process becomes unnecessary.

Then, a resist mask which is opened in the shape of the p-type lead electrode layer 114 and the n-type lead electrode layer 112 is formed by use of the photolithographic technology. Then, Ti and Au are deposited onto the substrate 110 by electron-beam evaporation in a thickness of 100 nm and 1000 nm, respectively, in this order from the side of the substrate 110. Lastly, a wiring layer material in portions except for openings of the resist mask is removed by the lift-off method, to form the p-type lead electrode layer 114 and the n-type lead electrode layer 112. As the layer structure of the p-type lead electrode layer 114 and the n-type lead electrode layer 112, the layer structure of Ti/Au, Ni/Au, Ti/Ag, Ni/Ag, Ti/Cu/Ag, Ni/Cu/Ag, or the like from the side of the substrate is available instead of the foregoing materials.

Then, a resist mask which is opened in the shape of the connection member layers 113 and 115 is formed by use of the photolithographic technology. Then, Ni, Au, Pt, (Au, Sn)n, and Au are continuously deposited thereon in a thickness of 10 nm, 100 nm, 100 nm, (50 nm to 200 nm, 50 nm to 200 nm)n, and 50 nm to 200 nm, respectively, in this order from the side of the substrate 110. Lastly, a material in a portion except for the openings is removed by use of the lift-off method, to form the n-type connection member layers 113 and the p-type connection member layers 115. The layer structure of the connection member layers 113 and 115 are determined in consideration of eutectic temperature and eutectic process. In this embodiment, the thickness of an Au layer and a Sn layer is 75.6 nm and 109.3 nm, respectively, and the number of repetition n is five. Although it is also possible to form an AuSn alloy layer by using eutectic metal as a source of vapor deposition, the layer structure of (Au/Sn)n/Au can obtain more stable eutectic bonding. When Au and Sn are laminated, increasing the ratio of Sn in accordance with the number of lamination makes it possible to lower the melting temperature of the surface of the connection member layer. Thus, adhesion to the electrode pads 107 and the p-type ohmic electrodes 105 formed in the light emitting device section 1 is improved. In this embodiment, although the connection member layers 113 and 115 are provided in the support substrate section 10, the connection member layers 113 and 115 may be provided in the light emitting device section 1. Otherwise, the connection member layers 113 and 115 may be provided in both of the support substrate section 10 and the light emitting device section 1.

The thickness of the support substrate 110 on which the connection member layers 113 and 115 have been formed is thinned to approximately 100 μm by grinding and polishing the surface opposite to the electrodes 112 and 114. Then, the support substrate 110 is divided into each support substrate section 10 by scribing and breaking, so that the support substrate section 10 is completed.

The completed light emitting device section 1 (FIGS. 2A and 2B) and the support substrate section 10 (FIGS. 3A and 3B) are bonded by use of a eutectic bonding device. Electrode patterns of the light emitting device section 1 and the support substrate section 10 are first aligned, and the light emitting device section 1 and the support substrate section 10 are pressure welded with pressure proper to the eutectic of the connection member layers 113 and 115. Then, the light emitting device section 1 and the support substrate section 10 are bonded by a proper eutectic temperature profile (heating, holding, and cooling). Since eutectic composition is Au/20Sn (Wt %) in this embodiment, the eutectic bonding is carried out at 280 to 330 degrees centigrade.

In the process of bonding the light emitting device section 1 to the support substrate section 10 by the eutectic bonding device, a position detection camera of the eutectic bonding device precisely detects the position of the light emitting device section 1. Thus, it is possible to bond the light emitting device section 1 to the support substrate section 10 while keeping correct positional relation. To detect the position, there are two or more predetermined alignment marks (for example, circles) which have different contrast from surroundings in the light emitting device section 1. Accordingly, in this embodiment, a region (electrode unformed region) in a predetermined shape in which the n-type ohmic electrode 104 is not disposed is provided in a portion of intersection of the partition grooves, to use the region as the alignment mark. When, for example, the light emitting device region 62 of the light emitting device section 1 is divided into 3×3 light emitting devices 12 by partition grooves 123, there are four or more intersections of the partition grooves 123. At this time, the corners of the light emitting devices 12 are rounded, four spaces surrounded by four curves appear in the intersections of the partition grooves. The electrode unformed region in the shape of an approximately circle is provided in each of the two spaces of the four spaces, to make them the alignment marks. When d (μm) represents the width of the partition groove 123, and r (μm) represents the radius of curvature of the rounded corner of the light emitting device 12, the following expression expresses the diameter $M_2$ (μm) of the approximately circular alignment mark formed in the space of the intersection.

$$M_{2r}(\mu m)=2(r\sqrt{2}-r)+d\sqrt{2}$$

According to this expression, the alignment mark of approximately 50 μm to 100 μm in diameter can be formed in the case of the light emitting device section 1 of the embodiment of FIGS. 1A-C.

The semiconductor light emitting device (flip chip) of FIGS. 1A and 1B was manufactured as described above. The completed semiconductor light emitting device (flip chip) is used while being bonded to a frame, a wiring board, a heat sink, a stem, and the like. A resinous adhesive, Sn—Ag soft solder (lead-free solder), Au—Sn hard solder, or the like is generally used in bonding. It is also possible to adjust the surface roughness of a polished surface in the rear surface of the substrate 110 of the support substrate section 10 in accordance with an object to be bonded. Taking the case of bonding by an Ag paste, for example, a roughly grinded and polished surface of the support substrate is superior in adhesion. In the case of bonding by solder or eutectic, since a Cu, Ag, Au, or Sn layer is formed in a grained and polished surface, a mirror finished surface is sometimes preferable.

The light emitting device section 1 may be directly bonded to a frame, a stem, a wiring board, a heat sink, and the like, instead of being bonded to the support substrate section 10 as the semiconductor light emitting device. For example, a heat sink is prepared in which a p-type lead electrode and an n-type lead electrode are formed in a plate-shaped ceramic 3 mm square and the lead electrodes are connected to an external connection electrode in the rear surface of the ceramic through via-holes. The light emitting device section 1 is connected to the heat sink through a connection member. A connection portion is covered with a side fill, so that a compact device module is completed.

FIGS. 13A, 13B, and 13C show another embodiment of a semiconductor light emitting device made in accordance with the principles of the invention. This semiconductor light emitting device is a flip chip in which a light emitting device section 1 shown in FIGS. 14A and 14B can be mounted on a support substrate section 10 shown in FIGS. 15A and 15B. The structure of the semiconductor light emitting device can be similar to that of the embodiment of FIGS. 1A-C, but can also be different from that of the embodiment of FIGS. 1A-C, such as in the way that a light emitting device region 62 is divided into m×m (3×3 in FIG. 14A) in the light emitting device section 1. Accordingly, in this example, external frames 121 of the light emitting device section 1 are disposed in the four corners of the light emitting device section 1. In the support substrate section 10, connection member layers 113 and 115 are disposed as shown in FIGS. 15A and 15B to apply drive voltage to the m×m light emitting devices 12. Increasing the dividing number of the light emitting device region 62, as described above, makes it possible to shorten the propagation distance of horizontal propagation light and prevent attenuation, so that the amount of light emitted from an emission surface 100a in the rear surface of a substrate 100 is increased.

The layer structure of a nitride semiconductor layer 11 can be the same as that of the embodiment of FIGS. 1A-C. In the end face of the light emitting device 12 for this example, however, a region from a p-type nitride semiconductor layer 103 to a terrace 125 of the nitride semiconductor layer 11 is vertical, and a region near to the substrate 100 than the terrace 125 is inclined. This is because, as is also described in FIG. 8B of the embodiment of FIGS. 1A-C, the intensity of emission light is weak in regions 128 and 129 which are within ±5 degrees with respect to the surface of a luminescent layer 102. When the p-type nitride semiconductor layer 103 is thin, the emission light has no effect on the intensity of light emitted from the emission surface 100a if the p-type nitride semiconductor layer 103 is not inclined.

In the embodiment of FIGS. 13A-C, for example, the depth of light emitting device region partition grooves 123 and external frame partition grooves 122 are shallow so as not to reach the substrate 100. This is because when the depth of the partition grooves 122 and 123 is 70% or more of the depth from the terrace 125 to the sapphire substrate 100, there is no effect on the reflection efficiency of the horizontal propagation light by the inclined surface.

The other structure of the device can be the same as that of the embodiment of FIGS. 1A-C, so that the same reference numbers refer to corresponding structure, and description thereof will be omitted. The inclination angle θ of the end face of the light emitting device 12 can also be set in the same manner as the embodiment of FIGS. 1A-C.

A principle that increase in the dividing number of the light emitting device region 62 causes increase in the amount of light emitted from the emission surface 100a in the rear surface of the substrate will be described. To increase the amount of emission light, increasing the area of the light emitting device region 62 is considered. In this case, it is forecasted that the horizontal propagation light increases, and light reflected by an n-type ohmic electrode 104 also increases. The ratio of the length of a side to the area of the light emitting device region 62 is calculated as shown in FIG. 16, wherein n represents an increment of the side and x represents the length of the side. When the length of the side is increased to 1x, 2x, 3x, 4x, and nx, the area becomes $x^2$, $(2x)^2$, $(3x)^2$, $(4x)^2$, ..., and $(nx)^2$. The total length of four sides 4nx is divided by the area $(nx)^2$, and 1 is substituted into x. Then, multiplying the result by ¼ for standardization, 1/n is obtained. As described above, when the side of the light emitting device region 62 is multiplied by n, the ratio of the side is reduced to 1/n, and the intensity of the horizontal propagation light reflected by the n-type ohmic electrode 104 per unit side becomes n times. According to actual measurement, however, the intensity of light reflected by the n-type ohmic electrode 104 hardly changes. Accordingly, it was found out that the horizontal propagation light largely attenuated, and hence most of the horizontal propagation light attenuated and disappeared before reaching the end face of the device 12 even if the area of the light emitting device region 62 was increased. Therefore, when the area of the light emitting device region 62 is increased, the takeout efficiency of the horizontal propagation light is reduced, and hence emission light output is reduced.

Figure 17:
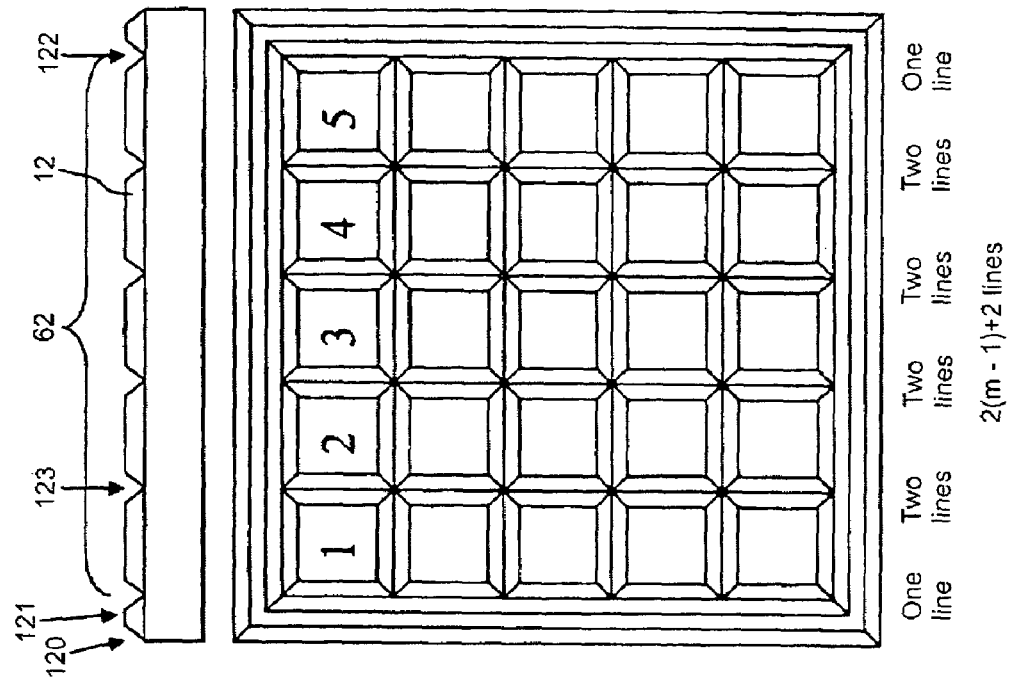
FIG. 17 is an explanatory view which shows the length of a side with respect to an area, when the area of the light emitting device region is fixed and a partition number is increased in the light emitting device of FIGS. 13A-C.

Accordingly, in this embodiment, the light emitting device region 62 is partitioned into a lattice pattern and is divided into the light emitting devices 12 with minute areas, in order to shorten the propagation distance of the horizontal propagation light and increase emission light output. Referring to FIG. 17, the length of a side of the light emitting device region 62 is fixed at y, and the side of the light emitting device region 62 is divided into m. Calculating the ratio of the length of the side to an area, when the dividing number m=1, 2, 3, 4, ..., and m, the length of the side becomes 4y, 8y, 12y, 16y, ..., and 4my. Thus, the length of the side/the area is represented by 4m/y. Substituting 1 into y and multiplying ¼ for standardization, the length of the side/the area becomes m. In other words, when the area of the light emitting device region 62 is fixed, and the side is divided into the division number m, the ratio of the side to the area is increased to m times. Therefore, when the length of the side of the light emitting device region 62 is multiplied by n, it is helpful to make the dividing number m of the side into n (m=n), in order to keep the ratio of the side per unit area at constant.

If a distance in which the horizontal propagation light of the light emitting device 12 attenuates and disappears is shorter than a half of the length of the side of the partitioned light emitting device 12, the intensity of light reflected by the n-type ohmic electrode 104 and then taken out of the sapphire substrate 100 follows the foregoing relation between n and m. When the attenuation and disappearance distance of the horizontal propagation light is equal to or longer than a half of the length of the side of the partitioned light emitting device 12, the takeout efficiency increases due to the foregoing relation.

The amount of attenuation of the horizontal propagation light largely differs according to the lamination structure and crystalline composition of the device, and a reflection angle. The shorter the propagation distance, the more the amount of attenuation is reduced. Thus, the length of the side of the light emitting device 12 can be shortened by increasing the partition number of the light emitting device region 62. Increasing the partition grooves 123, on the other hand, causes increase in the area of the partition grooves 123 occupying the light emitting device region 62. Since the area of the luminescent layer 102 is reduced, the amount of light emitted from the light emitting devices 12 is reduced. Accordingly, the partition number at which the largest amount of emission light is obtained can be determined in accordance with the relation between the area of the partition grooves 123 occupying the light emitting device region 62 and the propagation distance (the length of the side of the light emitting device 12) of the horizontal propagation light. Accordingly, the proper partition number is determined by experiment in which the intensity of emission light is measured while varying the partition numbers in advance. For example, the size of the substrate 100 of the light emitting device section 1 is 1.44 to 1.21 mm square, the partition number is 13×13 to 5×5, and the side of the partitioned light emitting device 12 is approximately 64 μm to 167 μm.

Three types of light emitting device sections 1 in which the light emitting device regions 62 were partitioned into 1×1, 3×3, and 5×5 respectively were actually manufactured, to measure emission output from the emission surface 100a in the rear surface of the substrate 100. The devices emitted light of 405 nm. The size of the substrate 100 of the light emitting device section 1 was 1 mm square. The devices had the structure as shown in FIG. 18A, in which the end face of the p-type nitride semiconductor layer 103 was inclined, and the depth of the partition groove 123 reached the sapphire substrate 100. As a comparative example, a light emitting device in which the n-type ohmic electrode 104 took a plane shape as shown in FIG. 18C and the partition number was 5×5 was manufactured, to measure emission output from the emission surface 100a in the rear surface of the substrate 100 in the same manner. As a result, as shown in FIG. 19, when the output from the device of the comparative example shown in FIG. 18C was represented by 100%, the outputs from the devices with the partition numbers of 1×1, 3×3, and 5×5 were 103%, 109%, and 115%, respectively. The rate of increase of the output with respect to the device of the comparative example was 3%, 9%, and 15%, and hence it was possible to estimate the effect of partitioning into the partition number m at 3×m (%). It was also verified that the ratio between front emission light and substrate end face emission light was improved to 85:15 in the device with the partition number of 5×5 of FIG. 18A, though the ratio between front emission light and substrate end face emission light was 70:30 in the device according to the comparative example of FIG. 18C.

A device in which the shape of the light emitting device with the partition number of 5×5 obtaining an output of 115% was changed as shown in FIG. 18B was manufactured to measure output from the emission surface 100a in the same manner. In the device, an end face from the surface of the p-type nitride semiconductor layer 103 to the terrace 125 was vertical, and the depth of the V-shaped groove was 5 μm, which was shallower than a distance 6 μm from the terrace 125 to the substrate 100. As a result, an output of 115% was obtained with respect to the comparative example, as in the case of the device with the partition number of 5×5 of FIG. 18A. As a result of various experiments, it was found out that if the depth of the partition groove 123 was 70% to 80% of a depth from the terrace 125 to the sapphire substrate 100, a sufficient reflection effect could be obtained. It is assumed that this function relates to a distance from the bottom of the partition groove 123 to the sapphire substrate 100 and the distance of a plane (connection terrace 123a) in the bottom of the partition groove 123, but a detail is uncertain.

The shallow partition groove 123 also has an advantage that the contact area of the n-type ohmic electrode 104 is large, and current density is reduced in a contact surface with the n-type nitride semiconductor layer 101, so that the degradation of the device due to a current mode is prevented. Since the current density is low, heat generation is reduced, so that it is possible to prevent the degradation of an electrode due to a heat mode.

In the embodiment of FIGS. 13A-C, as described above, the light emitting device section 1 can have structure as shown in FIGS. 14A and 14B, in which the light emitting device region 62 is partitioned into many light emitting devices 12 by the partition grooves 123, and the bottom of the partition groove 123 does not reach the substrate 100.

A method for designing the partition groove 123 will be described. The width (open width) W of the partition groove 123 is designed on the basis of the following expression 4, that is, W≅2T·tan ω+2L. The width (open width) V in the position of the terrace 125 is represented by the following expression 3, that is, V≅2T·tan ω. T represents a thickness from the terrace 125 to the substrate 100. Comparing a manufacturable minimum terrace width Lmin=5 μm with a terrace width calculation function f(j), which is obtained by experience to prevent the density of current flowing from the n-type ohmic electrode 104 into the n-type nitride semiconductor layer 101 being too large, larger one is made a terrace width L. In other words, When Lmin<f(j), $$L=f(j) \quad \text{Expression 1a}$$

When f(j)≦Lmin, $$L=Lmin \quad \text{Expression 1b}$$

The open angle θmax of the partition groove of the semiconductor device 12 is determined at 110 degrees. The width determination angle ω of the partition groove 123 is a half of the open angle θmax.

$$\omega=\tfrac{1}{2}\cdot\theta max \quad \text{Expression 2}$$

The whole width W and the width V in the position of the terrace 125 are calculated from the foregoing L and ω, and the thickness T from the terrace 125 to the substrate 100.

$$V\cong 2T\cdot\tan\omega \quad \text{Expression 3}$$

$$W\cong 2T\cdot\tan\omega+2L \quad \text{Expression 4}$$

In the case of the shallow partition groove 123, the depth D of the groove is 0.7 to 1 times the thickness T from the terrace 125 to the substrate 100. According to an experiment, approximately 0.8 was effective when T was 6 μm.

$$D=T\times(0.7 \text{ to } 1) \quad \text{Expression 5}$$

When there is one or more second terrace 126, 2L' is added to the foregoing expression 4, wherein L' represents the width of the second terrace 126. When there is no adjacent light emitting region and external groove, calculation may be performed on the supposition that the adjacent light emitting region and external groove exist. The foregoing relational expressions are effective, when the thickness T from the terrace 125 to the substrate 100 is approximately 2 to 15 μm. Modification may be required in the other cases.

A manufacturing method of the semiconductor light emitting device according to the embodiment of FIGS. 13A-C is similar to that of the embodiment of FIGS. 1A-C. It is helpful, however, to use a photomask having a pattern with a desired partition number, and to stop etching at a predetermined depth not reaching the sapphire substrate 100 when the partition grooves 123 are etched by dry etching. When the total thickness of the p-type nitride semiconductor layer 103 and the luminescent layer 102 is 0.3 μm, the thickness of the n-type nitride semiconductor layer is 5.7 μm, and the total thickness is 6 μm, for example, a depth from the surface of the semiconductor layer 11 to the terrace 125 may be 0.5 μm, and a depth from the terrace 125 to the bottom of the partition groove 123 may be 4.4 μm.

Figure 20B:
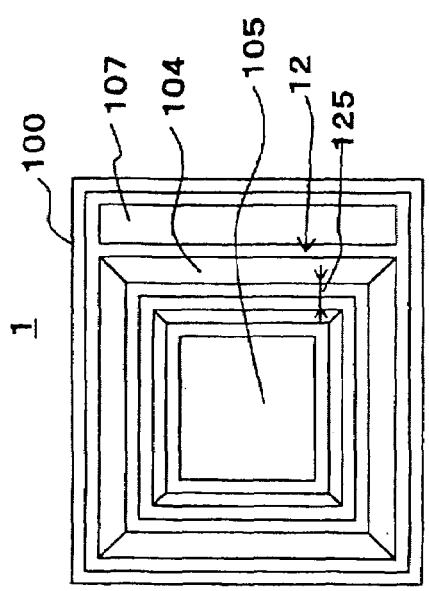
FIG. 20B is a plan view of a light emitting device section for the light emitting device of FIG. 20A.
Figure 20C:
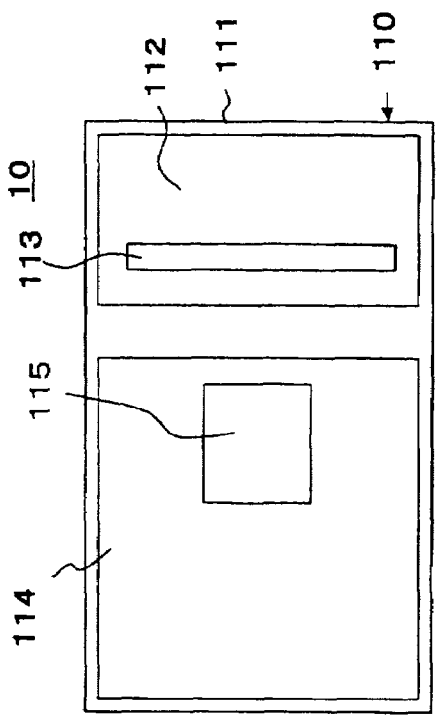
FIG. 20C is a plan view of a support substrate section.
Figure 20A:
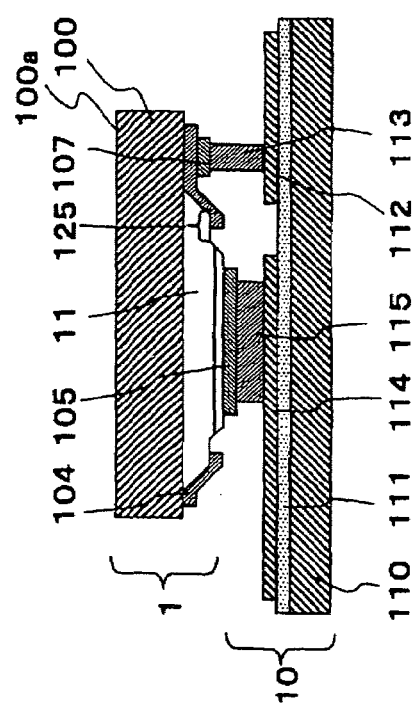
FIG. 20A is a cross sectional view showing another embodiment of a semiconductor light emitting device made in accordance with the principles of the invention.

The exemplary embodiment of FIGS. 20A-C will now be described.

In the embodiments of FIGS. 1A-C and 13A-C, the light emitting device region 62 of the light emitting device section 1 is partitioned into 2×2, 3×3, or more light emitting devices 12. In the exemplary embodiment shown in FIGS. 20A-C, however, a light emitting device region is not partitioned and is made into a single light emitting device. FIG. 20A is a sectional view of the whole device, and FIGS. 20B and 20C are plan views of a light emitting device section 1 and a support substrate section 10. The structure of a terrace 125 and an inclined end face of the device is the same as that of the embodiments of FIGS. 1A-C and 13A-C. Since the terrace 125 is provided, an n-type ohmic electrode 104 can reflect horizontal propagation light with high efficiency, while short circuiting with a luminescent layer 102 is prevented. Thus, it is possible to increase the intensity of light emitted from an emission surface 100a and stabilize electric characteristics, as compared with a device without the terrace 125. Manufacturing processes can be the same as those of the embodiment of FIGS. 1A-C, except that a pattern of a photomask can be different.

In the foregoing embodiments of FIGS. 13A-C and 20A-C, the light emitting device 12 takes the shape of a rectangle, the corners of which are orthogonal. The corners, however, may be rounded into the shape of an arc with a radius of curvature R, as shown in FIG. 2A. The radius of curvature R is, for example, 0.03 to 0.1 times the length of a side of the partitioned light emitting device 12. When the light emitting device 12 is a square with a size of 0.0036 mm$^2$ to 0.09 mm$^2$, for example, the appropriate radius R is 0.03 (3%) to 0.1 (10%) of the length of the side of the light emitting device 12. Rounding the corners of the light emitting device, as described above, makes it possible to eliminate an acute angle portion from a surface in which the n-type ohmic electrode 104 is formed, and hence stress does not locally concentrates. Therefore, it is possible to obtain the effect of preventing the rupture and exfoliation of the electrode due to the thermal expansion of the device. Furthermore, since the corners of the light emitting device 12 are rounded, the alignment mark can be formed in the portion (intersection of the partition grooves) surrounded by the four light emitting devices 12. Therefore, it is possible to improve precision in the bonding positions between the light emitting device section and the support substrate section.

In the embodiments of FIGS. 1A-C and 13A-C, the protective film 106 covers the whole device. A material with a lower refractive index than that of the nitride semiconductor layer 11 is available as the protective film 106 with low wettability. Accordingly, it is possible to obtain the effect of restraining light emission from a portion in which the electrodes 104 and 105 are not formed, and converting light into reflected or propagation light. If, for example, a porous SiO$_2$ film is formed as a first protective film with low wettability, and a close-grained SiO$_2$ film is formed as a second protective film with low wettability, micro cavities are formed in an interface, so that the refractive index becomes approximately the same as that of air.

Since the partition grooves 123 and the like according to the embodiments of FIGS. 1A-C and 13A-C have the shape of the letter V, it is possible to cover the partition grooves 123 with the n-type ohmic electrodes 104 and the protective film 106 without problem, if an oblique evaporation device is not used.

The nitride semiconductor layer 11 with a wavelength of 460 nm can be used in the embodiments of FIGS. 1A-C, 13A-C, and. The structure of a device made in accordance with the principles of the present invention can be applicable to a semiconductor layer with various wavelengths from ultraviolet rays to infrared rays. The principles of the present invention are especially effective when used or incorporated with a semiconductor layer 11 emitting light with a wavelength of 380 nm to infrared rays, which can obtain high reflectivity with respect to Ag used in the n-type ohmic electrode 104.

While there has been described what are at present considered to be exemplary embodiments of the present invention, it will be understood that various modifications may be made thereto, and it is intended that the appended claims cover all such modifications as fall within the true spirit and scope of the invention.

What is claimed is:

1. A semiconductor light emitting device comprising:
a substrate having a surface; and
a semiconductor layer disposed on at least a part of the surface of the substrate,
wherein the semiconductor layer includes,
a first conductive type semiconductor layer,
a luminescent layer,
a second conductive type semiconductor layer, and
a first electrode and a second electrode each disposed so as to make contact with the first conductive type semiconductor layer and the second conductive type semiconductor layer, respectively, wherein the first conductive type semiconductor layer, the luminescent layer, and the second conductive type semiconductor layer are laminated in this order from the substrate,
wherein the substrate is transparent so as to pass emission light from the luminescent layer,
an end face of the semiconductor layer includes a first terrace provided in an end face of the first conductive type semiconductor layer and positioned in parallel with the surface of the substrate, and an inclined end face region provided nearer to the substrate than the first terrace, and the inclined end face region being inclined with respect to the surface of the substrate,
the first electrode is disposed in the inclined end face region and is reflective, and the first electrode reflects light emitted from the luminescent layer to the substrate.

2. The semiconductor light emitting device according to claim 1, wherein:
the second electrode is disposed adjacent the second conductive type semiconductor layer; and
the first terrace is disposed in a region within 5 degrees with respect to a first line that extends parallel to the substrate from a point and passes through a center of the luminescent layer in a cross-sectional thickness direction, the region bounded by a second line extending from the point at an angle of 5 degrees with respect to the first line, the point defined by an intersection of the first line with a line extending from an end of the second electrode and perpendicular to the substrate.

3. The semiconductor light emitting device according to claim 1, wherein
the first terrace is disposed in a range within 0.3 μm from the luminescent layer in the thickness direction.

4. The semiconductor light emitting device according to claim 1, wherein
the first electrode is disposed so as to cover an area from a vicinity of a boundary between the first terrace and the inclined end face region to the whole inclined end face region.

5. The semiconductor light emitting device according to claim 1, wherein
a width of the first terrace in a direction in parallel with the substrate is greater than or equal to 5 μm.

6. The semiconductor light emitting device according to claim 1, wherein
an inclination angle of the inclined end face region is between 35 degrees and 50 degrees with respect to the surface of the substrate.

7. The semiconductor light emitting device according to claim 1, wherein
at least one second terrace which is approximately in parallel with the surface of the substrate is disposed in the inclined end face region between the first terrace and the substrate.

8. The semiconductor light emitting device according to claim 7, wherein:
the first conductive type semiconductor layer includes a layer with high impurity concentration; and
at least one of the second terraces is disposed in the layer with high impurity concentration.

9. The semiconductor light emitting device according to claim 1, wherein
the end face of the semiconductor layer in a region from the surface of the second conductive type semiconductor layer to the first terrace is approximately vertical with respect to the surface of the substrate.

10. The semiconductor light emitting device according to claim 1, wherein
the end face of the semiconductor layer in a region from the surface of the second conductive type semiconductor layer to the first terrace is inclined with respect to the surface of the substrate.

11. A semiconductor light emitting device comprising:
a substrate; and
a semiconductor layer disposed on at least a part of a surface of the substrate, wherein
the semiconductor layer includes,
a first conductive type semiconductor layer including an end face,
a luminescent layer,
a second conductive type semiconductor layer, and
a first electrode and a second electrode each disposed so as to make contact with the first conductive type semiconductor layer and the second conductive type semiconductor layer, respectively, wherein the first conductive type semiconductor layer, the luminescent layer, and the second conductive type semiconductor layer are laminated in this order from the substrate,
wherein the substrate is transparent so as to pass emission light from the luminescent layer,
the semiconductor layer is divided into a plurality of partitions by a partition groove, the partition groove including an end face,
the end face of the partition groove forms an end face of the semiconductor layer,
the end face of the first conductive type semiconductor layer includes an inclined end face region, the inclined end face region being inclined so as to reflect light emitted from the luminescent layer to the substrate,
the first electrode is disposed in the inclined end face region and is reflective, and
the end face of the first conductive type semiconductor layer is provided with a first terrace that is positioned in parallel with the surface of the substrate, and the inclined end face region is disposed nearer to the substrate than the first terrace.

12. The semiconductor light emitting device according to claim 11, wherein:
the second electrode is disposed adjacent the second conductive type semiconductor layer; and
the first terrace is disposed in a region within 5 degrees with respect to a first line that extends parallel to the substrate from a point and which passes through a center of the luminescent layer in a cross-sectional thickness direction, the region bounded by a second line extending from the point at an angle of 5 degrees with respect to the first line, the point defined by an intersection of the first line with a line extending from an end of the second electrode and perpendicular to the substrate.

13. The semiconductor light emitting device according to claim 11, wherein
the first terrace is disposed in a range within 0.3 μm from the luminescent layer in the thickness direction.

14. The semiconductor light emitting device according to claim 11, wherein
the first electrode is disposed so as to cover an area from a vicinity of a boundary between the first terrace and the inclined end face region to the whole inclined end face region.

15. The semiconductor light emitting device according to claim 11, wherein
a width of the first terrace in a direction in parallel with the substrate is greater than or equal to 5 μm.

16. The semiconductor light emitting device according to claim 11, wherein
an inclination angle of the inclined end face region is between 35 degrees and 50 degrees with respect to the surface of the substrate.

17. The semiconductor light emitting device according to claim 11, wherein
at least one second terrace which is approximately in parallel with the surface of the substrate is disposed in the inclined end face region between the first terrace and the substrate.

18. The semiconductor light emitting device according to claim 17, wherein:
the first conductive type semiconductor layer includes a layer with high impurity concentration; and
at least one of the second terraces is disposed in the layer with high impurity concentration.

19. The semiconductor light emitting device according to claim 11, wherein
the end face of the semiconductor layer in a region from the surface of the second conductive type semiconductor layer to the first terrace is approximately vertical with respect to the surface of the substrate.

20. The semiconductor light emitting device according to claim 11, wherein
the end face of the semiconductor layer in a region from the surface of the second conductive type semiconductor layer to the first terrace is inclined with respect to the surface of the substrate.

21. The semiconductor light emitting device according to claim 11, wherein
the partition groove has a depth such that the partition groove reaches the substrate, and
the partition groove includes an inclined end face region extending from the first terrace to a top face of the substrate.

22. The semiconductor light emitting device according to claim 11, wherein
the partition groove has a depth such that the partition groove does not reach the substrate; and
the partition groove includes an inclined end face region extending from the first terrace to a bottom of the partition groove.

23. The semiconductor light emitting device according to claim 22, wherein
the depth of the partition groove is greater than or equal to 70% of a distance from the first terrace to the substrate.

24. The semiconductor light emitting device according to claim 11, wherein
a corner of one of the partitions divided by the partition groove is rounded.

25. The semiconductor light emitting device according to claim 24, wherein the radius of curvature of the rounded corner is 0.03 to 0.1 times the length of a shorter side of the one of the partitions.

26. The semiconductor light emitting device according to claim 11, wherein a region having a predetermined shape is provided at an intersection of the partition grooves and is spaced from the first electrode.

27. The semiconductor light emitting device according to claim 11, wherein an area of one of the partitions is 0.0036 mm$^2$ to 0.09 mm$^2$.

28. The semiconductor light emitting device according to claim 11, wherein the inclined end face region of the first conductive type semiconductor layer has at least two different inclination angles.

29. The semiconductor light emitting device according to claim 2, wherein the second line extends downward towards the substrate from the point.

30. The semiconductor light emitting device according to claim 12, wherein the second line extends downward towards the substrate from the point.

* * * * *